(12) United States Patent
Maruyama et al.

(10) Patent No.: US 7,685,706 B2
(45) Date of Patent: Mar. 30, 2010

(54) METHOD OF MANUFACTURING A SEMICONDUCTOR DEVICE

(75) Inventors: Junya Maruyama, Ebina (JP); Tomoyuki Aoki, Atsugi (JP)

(73) Assignee: Semiconductor Energy Laboratory Co., Ltd, Atsugi-shi, Kanagawa-ken (JP)

( * ) Notice: Subject to any disclaimer, the term of this patent is extended or adjusted under 35 U.S.C. 154(b) by 414 days.

(21) Appl. No.: 11/474,934

(22) Filed: Jun. 27, 2006

(65) Prior Publication Data

US 2007/0020932 A1     Jan. 25, 2007

(30) Foreign Application Priority Data

Jul. 8, 2005     (JP)     ............... 2005-200756

(51) Int. Cl.
H05K 3/02      (2006.01)
H05K 3/10      (2006.01)

(52) U.S. Cl. ............... 29/846; 29/600; 29/601; 29/825; 29/840; 29/885; 257/E23.064; 340/572.1; 340/572.7

(58) Field of Classification Search ............... 29/846, 29/572, 589, 591, 600, 601, 738–740, 825, 29/840, 885; 156/300, 555; 257/E23.064; 340/572.1, 572.7; 438/108, 121, 409
See application file for complete search history.

(56) References Cited

U.S. PATENT DOCUMENTS

| | | | |
|---|---|---|---|
| 5,852,289 A | 12/1998 | Masahiko | |
| 6,173,898 B1 | 1/2001 | Mande | |
| 6,208,019 B1 | 3/2001 | Tane et al. | |
| 6,362,523 B1 | 3/2002 | Fukuda | |
| 6,412,702 B1 | 7/2002 | Ishikawa et al. | |
| 6,451,154 B1 * | 9/2002 | Grabau et al. | ............... 156/300 |
| 6,563,202 B1 | 5/2003 | Ohsawa et al. | |
| 6,910,636 B2 | 6/2005 | Kim et al. | |
| 6,933,533 B2 | 8/2005 | Yamazaki et al. | |
| 2004/0200061 A1 * | 10/2004 | Coleman et al. | ............... 29/825 |

FOREIGN PATENT DOCUMENTS

| | | |
|---|---|---|
| JP | 58-050797 | 3/1983 |
| JP | 2000-299339 | 10/2000 |
| JP | 2001-284521 | 10/2001 |
| JP | 2002-151829 | 5/2002 |
| JP | 2004-087597 | 3/2004 |
| JP | 2004-282487 | 10/2004 |

* cited by examiner

*Primary Examiner*—Thiem Phan
(74) *Attorney, Agent, or Firm*—Eric J. Robinson; Robinson Intellectual Property Law Office, P.C.

(57) ABSTRACT

A manufacturing method of a wiring board and a semiconductor device at low cost and by a simple process, without performing complicated steps many times is proposed. Furthermore, a manufacturing method of a wiring board at low cost and with fewer adverse effects on the environment, and a manufacturing method of a semiconductor device using the wiring board are proposed. A pattern of a conductive material is formed over a first substrate, a conductive film is formed over the pattern by an electrolytic plating process, the pattern and the conductive film are separated, an IC chip including at least one thin film transistor is formed over a second substrate, and the conductive film is electrically connected to the IC chip.

18 Claims, 17 Drawing Sheets

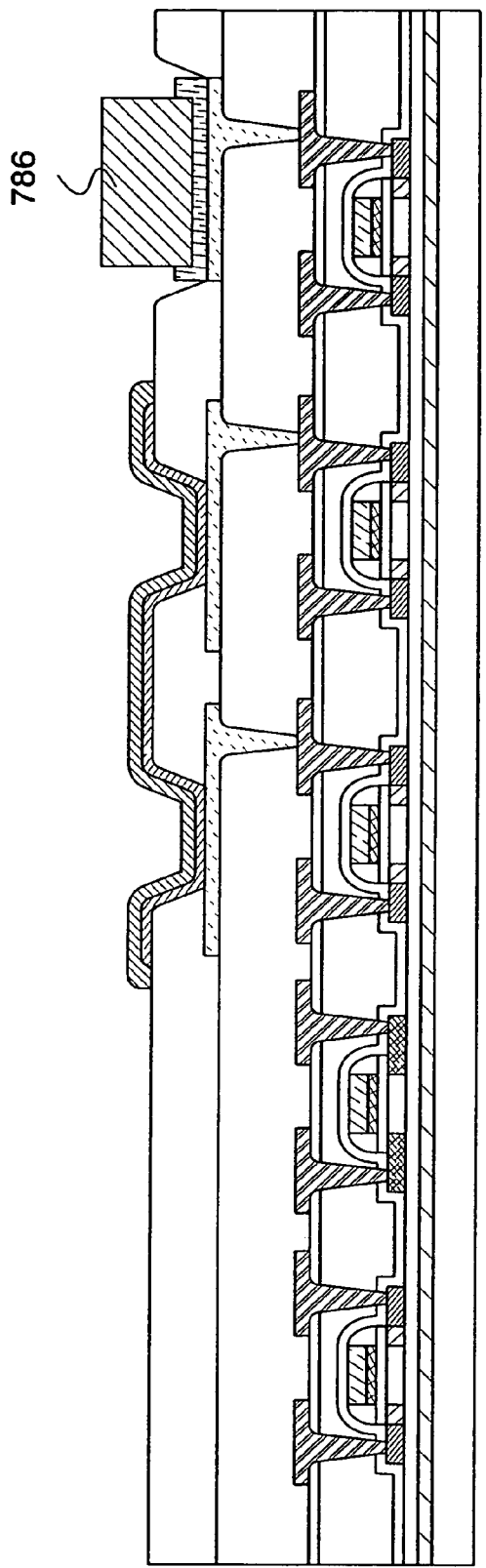
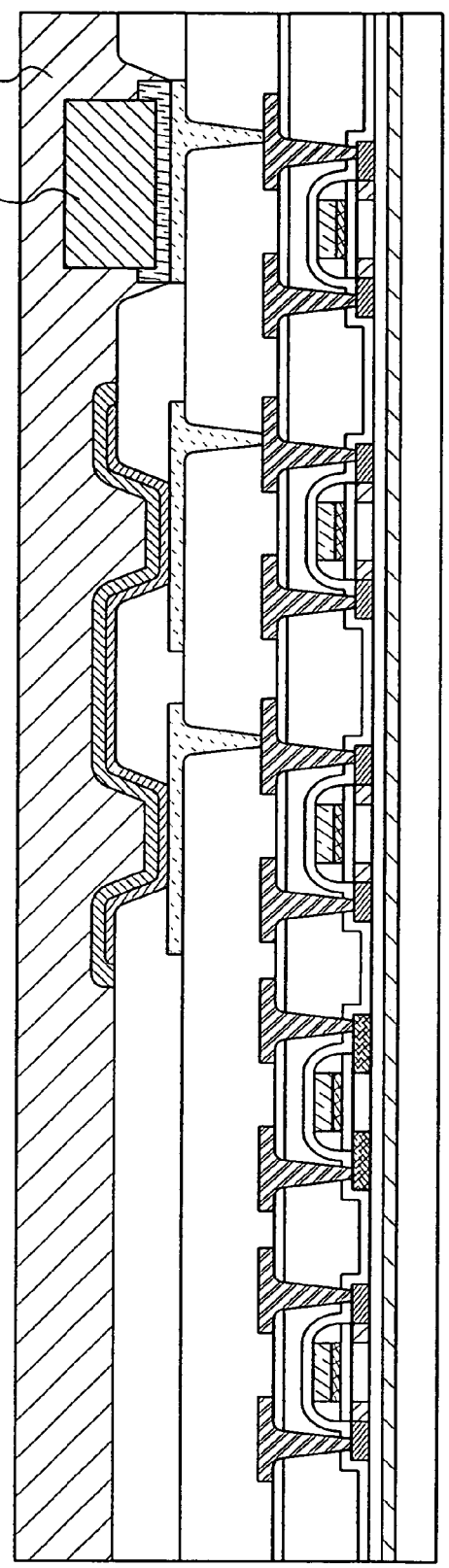
FIG. 7A
FIG. 7B

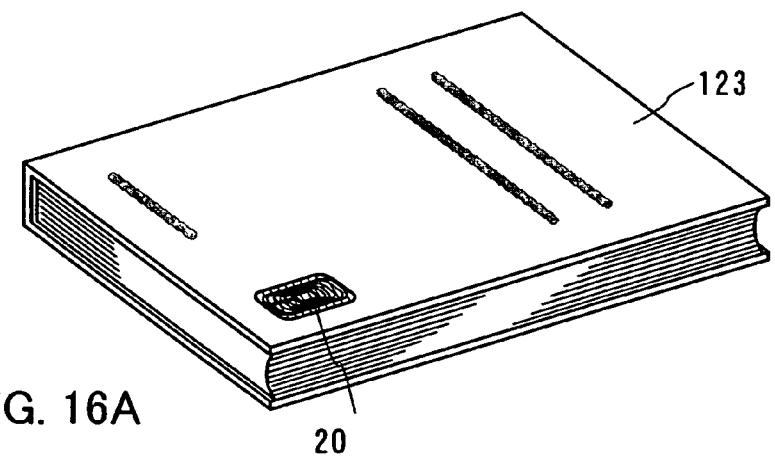
FIG. 16A
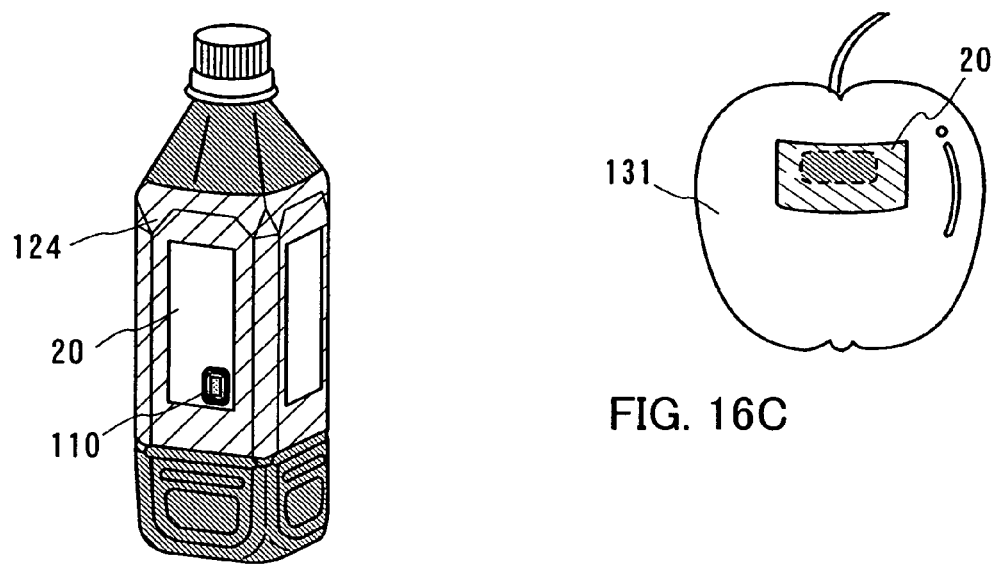
FIG. 16B
FIG. 16C
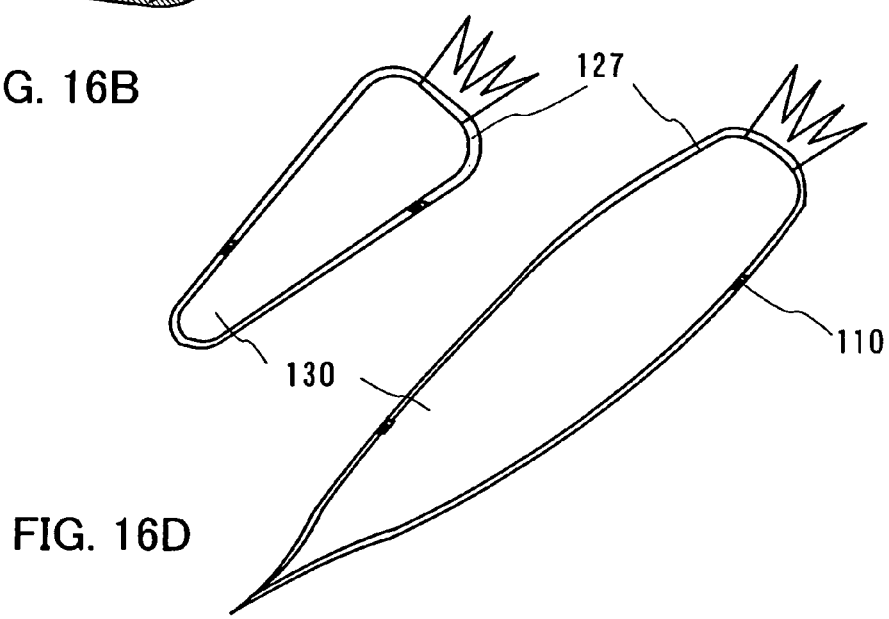
FIG. 16D

METHOD OF MANUFACTURING A SEMICONDUCTOR DEVICE

CROSS REFERENCE TO RELATED DOCUMENTS

This application claims benefit of JAPAN Patent Application No. 2005-200756, filed on Jul. 8, 2005.

BACKGROUND OF THE INVENTION

1. Field of the Invention

The present invention relates to a manufacturing method of wiring boards with various shapes and a manufacturing method of a semiconductor device using the wiring board.

2. Description of the Related Art

In recent years, the necessity of a card equipped with an RFID (Radio Frequency Identification) or a tag equipped with an RFID which can transmit and receive data without contact has been increased in various fields which need automatic identification such as management of valuable securities and merchandise. The card equipped with an RFID reads and writes data from/to an external device without contact, via an antenna with a shape adapted to the frequency band that is used when transmitting and receiving data. The card equipped with an RFID has larger memory capacity and higher security than a magnetic card that records data by a magnetic recording method. Hence, modes of the card equipped with an RFID applicable to various fields have been proposed recently.

In general, a semiconductor device such as an RFID includes an antenna and an IC chip, and there are a case where an antenna is formed directly on an IC chip and a case where an antenna is formed separately from an IC chip and then connected to the IC chip. In the latter case, an antenna pattern is generally formed over a PCB (Printed Circuit Board, a glass epoxy resin) substrate which is called a rigid substrate, or an FPC (Flexible Printed Circuit, a polyimide resin) substrate which is called a flexible substrate. The antenna pattern is conventionally formed by forming a copper foil over a PCB substrate or an FPC substrate and then patterning the copper foil by an etching method or a photolithography method (Patent Document 1: Japanese Patent Laid-Open No. 2001-284521 and Patent Document 2: Japanese Patent Laid-Open No. 2004-282487, for example).

In addition, for forming a minute wiring of a semiconductor element, a method in which an electrolytic plating film is formed by an electrolytic plating process on a wiring pattern of a conductive material, so as to be used as a wiring is known (Patent Document 3: Japanese Patent Laid-Open No. 2004-87597, for example).

However, in the case where an antenna is formed by patterning a copper foil as described above, copper in a region which is not left as a pattern needs to be treated as waste, and use efficiency of the raw material is low. Furthermore, copper in a region which is not left as a pattern should be treated as waste, which is not good for the environment.

In addition, in the case where a copper foil pattern is processed by a photolithography method, for example, a photo resist, exposure equipment, a developing apparatus, etching equipment for copper, photo resist removal equipment, a drying device and the like are needed. Therefore, high equipment investment is required for manufacturing an antenna, which disturbs reduction in manufacturing cost of an antenna.

Furthermore, in the case of manufacturing a minute wiring by an electrolytic plating process as in the conventional manner, a wiring pattern and an electrolytic plating film are used as a wiring. However, if only the electrolytic plating film is used as a wiring and the wiring pattern part is reused, usage of a conductive material as the wiring pattern can be reduced, and cost of the semiconductor element and adverse effects of the manufacturing process on the environment can also be reduced.

SUMMERY OF THE INVENTION

In view of the above problems, it is an object of the invention to provide a formation method of a wiring board and a manufacturing method of a semiconductor device, at low cost and with fewer adverse effects on the environment.

One feature of a manufacturing method of a wiring board according to the invention is to include the steps of: forming a pattern having conductivity over a substrate; forming a conductive film over the pattern by an electrolytic plating process; and separating the pattern and the conductive film.

Another feature of a manufacturing method of a wiring board according to the invention is to include the steps of: forming a pattern having conductivity over a substrate; forming a conductive film over the pattern by an electrolytic plating process; and attaching a base substance to the conductive film and then peeling the base substance from the substrate so that the pattern and the conductive film are separated from each other.

One feature of a manufacturing method of a semiconductor device according to the invention is to include the steps of: forming a pattern having conductivity over a first substrate; forming a conductive film over the pattern by an electrolytic plating process; separating the pattern and the conductive film; forming an IC chip including at least one thin film transistor over a second substrate; and connecting the conductive film to the IC chip electrically.

Another feature of a manufacturing method of a semiconductor device according to the invention is to include the steps of: forming a pattern having conductivity over a first substrate; forming a conductive film over the pattern by an electrolytic plating process; separating the pattern and the conductive film; forming an IC chip including at least one thin film transistor over a second substrate; connecting the conductive film to the IC chip electrically, peeling the IC chip from the second substrate; and covering the IC chip and the conductive film with a third substrate.

Another feature of a manufacturing method of a semiconductor device according to the invention is that the third substrate is polypropylene, polyester, vinyl, polyvinyl fluoride, vinyl chloride, paper made of a fibrous material, or an antistatic film.

Another feature of a manufacturing method of a semiconductor device according to the invention is that the third substrate is a laminated film of polyester, polyamide, an inorganic deposition film, or paper, and an adhesive synthetic resin such as an acrylic-based synthetic resin or an epoxy-based synthetic resin.

Another feature of a manufacturing method of a semiconductor device according to the invention is that the pattern comprises a material including iron (Fe), aluminum (Al), copper (Cu), silver (Ag), nickel (Ni), tungsten (W), titanium (Ti), magnesium (Mg), niobium (Nb), or tin (Sn).

Another feature of a manufacturing method of a semiconductor device according to the invention is that the conductive film includes an alloy of silver (Ag) and gold (Au), an alloy of copper (Cu) and gold (Au), an alloy of nickel (Ni) and gold (Au), an alloy of cadmium (Cd) and gold (Au), an alloy of cobalt (Co) and gold (Au), copper (Cu), nickel (Ni), tin (Sn), lead (Pb), chromium (Cr), gold (Au), silver (Ag), rhodium (Rh), cadmium (Cd), or cobalt (Co).

By using a manufacturing method of a wiring board according to the invention, a wiring board can be manufactured at low cost by a simple process, without performing complicated steps many times. Furthermore, in the manufacturing method of the invention, a conductive resin pattern and an electrolytic plating bath for forming a wiring board can be reused, so that a wiring board can be manufactured at low cost.

By using a wiring board manufactured according to the invention, a semiconductor device can be manufactured at low cost by a simple process, without performing complicated steps many times.

BRIEF DESCRIPTION OF THE DRAWINGS

FIGS. 7A and 7B are views showing a manufacturing method of a semiconductor device of the invention.

FIGS. 16A to 16D are views showing usage patterns of a semiconductor device of the invention.

DETAILED DESCRIPTION OF THE INVENTION

Embodiment Modes

Figure 1A:
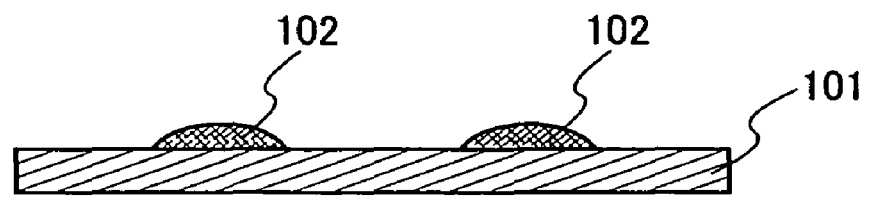
FIGS. 1A to 1D are views showing a manufacturing method of a wiring board of the invention.

Embodiment modes of the invention will be described hereinafter with reference to the drawings. However, the invention is not limited to the following description, and it is easily understood by those skilled in the art that the modes and details can be changed in various ways without departing from the spirit and scope of the invention. Therefore, the invention is not interpreted as being limited to the following description of the Embodiment Modes. In the structure of the invention described hereinafter, reference numerals and symbols denoting the same objects are used in common in different drawings.

Embodiment Mode 1

In this embodiment mode, a formation method of a wiring board by an electrolytic plating process will be described. FIGS. 1A to 1D are cross-sectional views of a manufacturing process of a wiring board of this embodiment mode.

First, as shown in FIG. 1A, a pattern 102 made of a conductive material is formed over a substrate 101. As the substrate 101, a glass substrate such as barium borosilicate glass or alumino borosilicate glass, a quartz substrate, a ceramic substrate, a silicon substrate or the like can be used. Besides, a substrate made of a flexible synthetic resin such as plastic typified by polyethylene terephthalate (PET), polyethylene naphthalate (PEN), and polyether sulfone (PES), or an acrylic can be used.

Figure 1B:
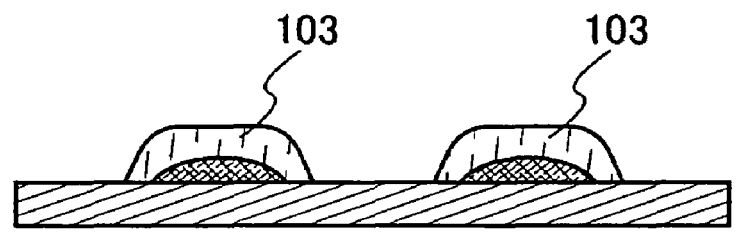
Figure 1C:
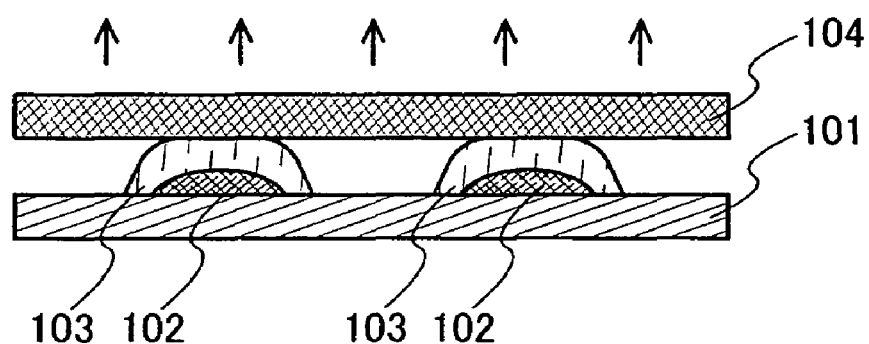

The pattern 102 can be formed by a screen printing method, a vacuum deposition method, a sputtering method, a method in which a conductive material is applied over the entire surface of a glass substrate and then a needless part is removed by laser beam, a method in which droplets are discharged from a narrow tube with a tiny opening which is typified by an ink-jet method, a method in which a viscous material or droplets are pushed out from a narrow tube with a diameter of several millimeters or less using a dry gas which is typified by a dispense method, or the like. In addition, conductive films with various shapes can be manufactured by changing the shape of the pattern 102. In FIGS. 1A to 1C, the pattern 102 has a shape with a curved surface. That is, a cross-sectional shape of the pattern 102 is arched. However, the surface and cross-sectional shape of the pattern 102 are not limited thereto. For example, the cross-sectional shape may be a shape such as a semicircle partially making an arc, or a polygon such as a triangle or a quadrangle.

As a material of the pattern 102, a metal selected from iron (Fe), aluminum (Al), copper (Cu), silver (Ag), nickel (Ni), tungsten (W), titanium (Ti), magnesium (Mg), niobium (Nb), tin (Sn), and the like can be used, or a compound including iron (Fe), aluminum (Al), copper (Cu), silver (Ag), nickel (Ni), tungsten (W), titanium (Ti), magnesium (Mg), niobium (Nb) or tin (Sn) as its main component and a small amount of other element may be used. In addition, an alloy material including iron (Fe), aluminum (Al), copper (Cu), silver (Ag), nickel (Ni), tungsten (W), titanium (Ti), magnesium (Mg), niobium (Nb) or tin (Sn) as its main component may be used. In addition, a material of a metal resin in which iron (Fe), aluminum (Al), copper (Cu), silver (Ag), nickel (Ni), tungsten (W), titanium (Ti), magnesium (Mg), niobium (Nb) or tin (Sn) is dispersed may be used.

Next, the substrate 101 with the pattern 102 formed thereover is washed. It is a treatment performed for removing dirt of greases attached on the base material surface, and there are a solvent degreasing method, an emulsion degreasing method, an alkaline degreasing method, an electrolytic degreasing method, an ultrasonic degreasing method, and the like. By arbitrarily repeating these, degreasing washing is performed.

Figure 2:
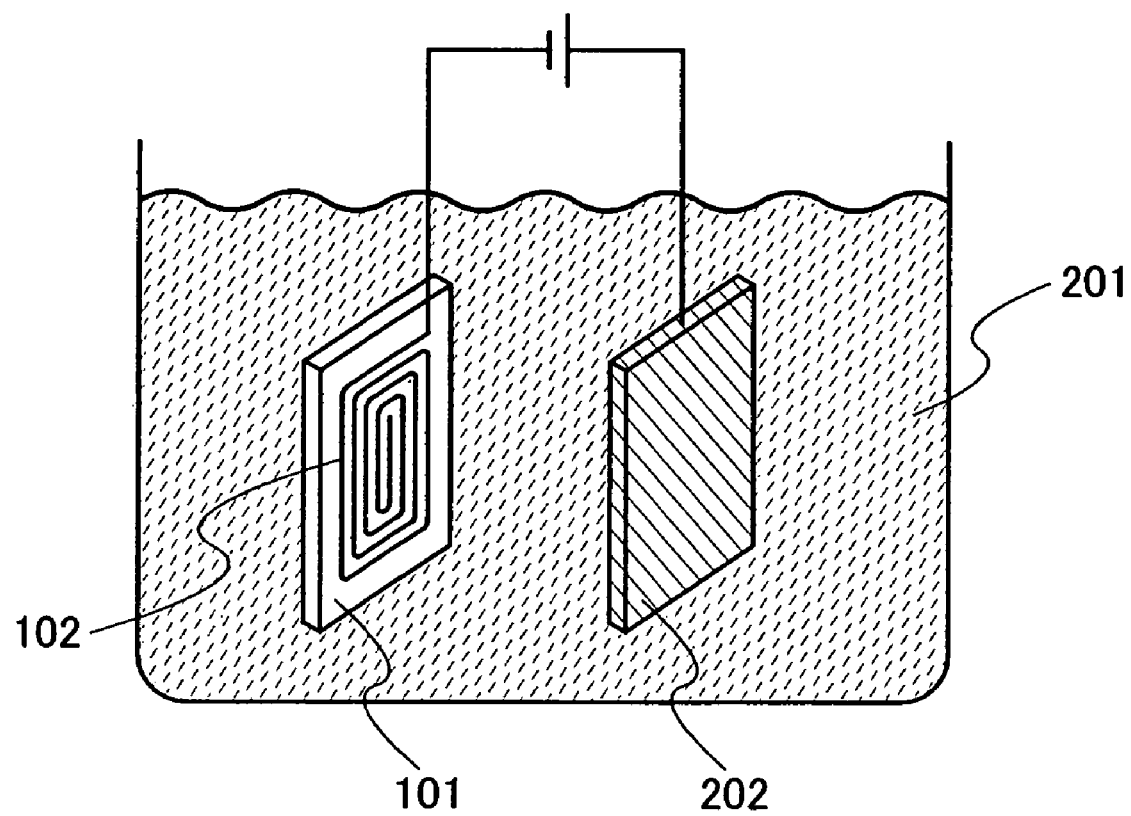
FIG. 2 is a view showing a manufacturing method of a wiring board of the invention.

Next, an electrolytic plating process is performed on the washed substrate 101, and a conductive film 103 is formed over the pattern 102 (FIG. 1B). A schematic view of the electrolytic plating process is shown in FIG. 2. In the electrolytic plating process, the substrate 101 and a metal plate 202 are soaked in an electrolytic plating bath 201, as shown in FIG. 2, and a current is applied between the pattern 102 and the metal plate 202 using the pattern 102 over the substrate 101 as a cathode and the metal plate 202 as an anode, so that a conductive film having the same conductivity type as the metal plate is formed over the pattern 102. As the metal plate, a metal selected from copper (Cu), nickel (Ni), tin (Sn), lead (Pb), chromium (Cr), gold (Au), silver (Ag), rhodium (Rh), cobalt (Co), cadmium (Cd) and the like, or an alloy of Ag, Cu, Ni, cadmium (Cd), cobalt (Co) or the like and Au, or the like may be used. A material of the metal plate 202 and a material of the pattern 102 described in this embodiment can be selected freely and combined, as long as they are easily peeled from each other. The pattern 102 and the metal plate 202 may be connected in any way, as long as they are electrically connected. After the electrolytic plating, the substrate 101 is taken out from the electrolytic plating bath, and the substrate is washed using pure water.

Figure 1D:
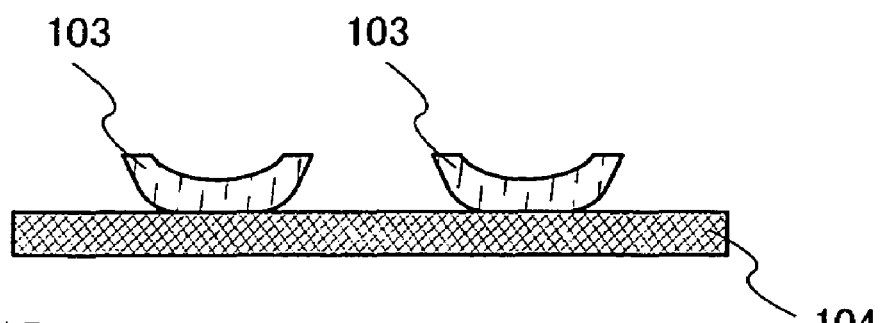

After that, a transposing base substance 104 is attached to the conductive film 103, and then the transposing base substance 104 is peeled from the substrate 101, so that the conductive film 103 and the pattern 102 are separated from each other (FIGS. 1C and 1D). That is, the conductive film 103 is transposed to the transposing base substance 104. It is to be noted that all of the conductive films 103 formed over the pattern 102 are not necessarily peeled off and transposed to the transposing base substance 104, and part of the conductive films 103 may be separated from the pattern 102 and transposed to the transposing base substance 104 according to need. The conductive film 103 separated from the pattern 102 in this way is referred to as a wiring board. A surface of the conductive film 103 on a side which has been in contact with the pattern 102 has the similar shape as a surface of the pattern 102 on a side which has been in contact with the conductive film 103. That is, the cross-sectional shape of the conductive film 103 is partially the same as the cross-sectional shape of the pattern 102. As the transposing base substance 104, for example, a slightly-adhesive peeling tape, a thermal peeling tape, an ultraviolet peeling tape or the like may be used. The conductive film 103 separated from the pattern 102 can be used as various wirings such as an antenna and a wiring connecting elements. For example, by connecting the conductive film 103 manufactured according to this embodiment mode to an IC chip, the conductive film 103 can be used as an antenna of a semiconductor device. In addition, the conductive film 103 manufactured according to this embodiment mode can be used as a wiring of a semiconductor element. It is to be noted that, in this embodiment mode, since the conductive film 103 is formed by an electrolytic plating process, the conductive film 103 may contact with but not be fastened to the substrate 101. Therefore, by using a combination of materials which are easily peeled from each other as materials for the metal plate 202 (the conductive film 103) and the pattern 102 when performing the electrolytic plating process, the pattern 102 and the conductive film 103 can be easily peeled from each other.

In this embodiment mode, a wiring board can be formed by an electrolytic plating process which is an easy process. Furthermore, wiring boards with various shapes can be easily formed by changing the shape of the pattern. In the case of using the wiring board as an antenna, for example, antennas with various shapes such as dipole, circle (a loop antenna, for example) and flat rectangular solid (a patch antenna, for example) can be formed. Furthermore, in the manufacturing method of this embodiment mode, the substrate 101, the pattern 102 formed thereover, and the electrolytic plating bath 201 for forming a wiring board can be reused; therefore, the wiring board can be manufactured at low cost.

Embodiment Mode 2

Figure 3A:
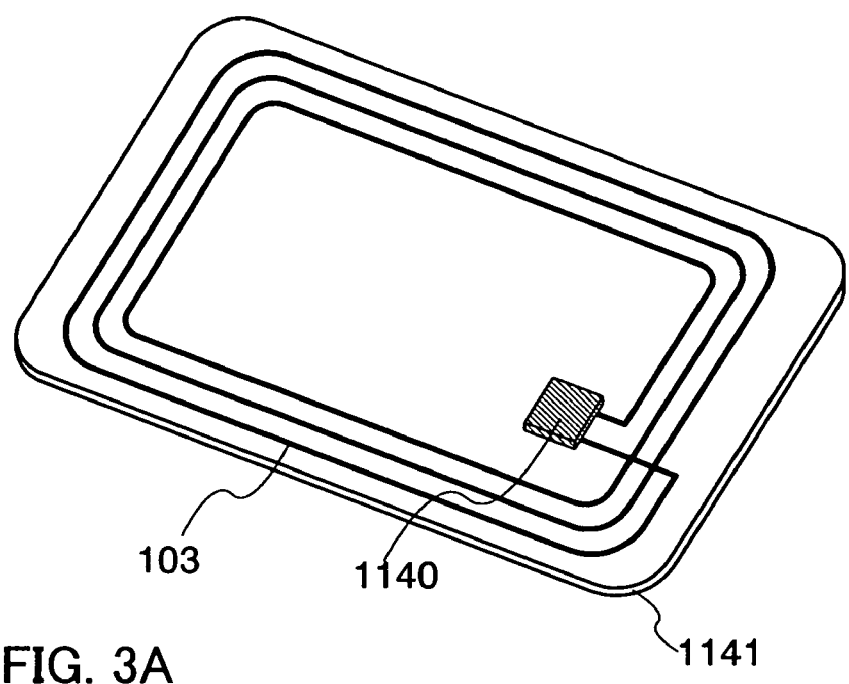
FIGS. 3A to 3C are views showing a manufacturing method of a semiconductor device of the invention.

In this embodiment mode, one mode of a method for connecting a wiring board manufactured according to Embodiment Mode 1 to an IC chip will be described. In this embodiment mode, as shown in FIG. 3A, a semiconductor device in which a conductive film 103 and an IC chip 1140 including a plurality of thin film transistors are provided over a substrate 1141 will be described. It is to be noted that the conductive film 103 is electrically connected to at least one of the thin film transistors included in the IC chip 1140 by connecting the conductive film to the IC chip. In addition, the semiconductor device can exchange data between the IC chip and an external device (reader/writer) without contact, via the conductive film 103. It is to be noted that an element which can communicate data by radio communication is referred to as a semiconductor device in this specification. Such a semiconductor device is also referred to as an IC tag, an ID tag, an RF (Radio Frequency) tag, an RFID (Radio Frequency Identification), a wireless tag, an electronic tag, a wireless processor, a wireless memory, a wireless chip or the like.

Figure 3B:
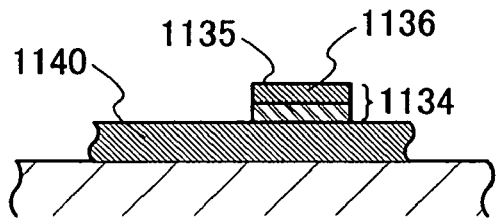

First, as shown in FIG. 3B, a bump 1134 for joining the IC chip 1140 and the conductive film 103 is formed over the IC chip 1140. The bump 1134 can be formed by using a screen printing method, a sputtering method, a method in which a conductive material is applied over the entire surface of a glass substrate and then a needless part is removed by laser beam, a method in which droplets are discharged by airflow from a narrow tube with a tiny opening which is typified by an ink-jet method, a method in which a viscous material or droplets are pushed out from a narrow tube with a diameter of several millimeters or less using a dry gas which is typified by a dispense method, or the like. In this embodiment mode, a formation method using a screen printing method will be described.

First, a conductive resin 1135 is put on a printing plate, and the conductive resin (conductive paste) 1135 is applied by a scraper on an opening of the printing plate, which is formed corresponding to the bump pattern forming part and the entire surface of the printing plate. Here, for example, a printing plate with mesh number #40 to #400 can be used, and a resin containing silver (Acheson (Japan) Ltd., product name: Electrodag427SS, using a polyester-based resin as a binder) can be used as the conductive resin. Here, the mesh number # shows the number of lines per one inch. Furthermore, in the case of using a resin containing silver as the conductive resin, the scraper and the printing plate are set so as not to be in contact with each other, and the resin containing silver may be applied with the scraper moving speed of 3 to 300 mm/sec.

Next, the conductive resin 1135 is applied over a base material, using a squeegee. At this time, preferably, the squeegee is put in contact with the printing plate, the pushing pressure is 0.14 to 0.175 MPa, using compressed air, and the moving speed is 3 to 300 mm/sec. After the printing, leveling of the printed matter is performed for five minutes, for example, in order to reduce unevenness of the resin, and then baking is performed for 15 to 45 minutes at 75 to 120° C., thereby the bump is formed. The baking may be performed in an indirect heating atmosphere.

Subsequently, an anisotropic conductive resin 1136 is formed over the conductive resin 1135 by screen printing. For example, a screen printing plate with mesh number #80 to #165 may be used, ACP (manufactured by Three Bond Co., Ltd., 3373C) is put on the printing plate as the anisotropic conductive resin 1136, for example, and the anisotropic conductive resin 1136 is applied by a scraper on an opening corresponding to the bump pattern forming part and the entire surface of the printing plate. At this time, the scraper and the printing plate are at a distance so as not to be in contact with each other, and the scraper moving speed may be 3 to 300 mm/sec. Next, the anisotropic conductive resin is applied over the base material from the opening of the printing plate by using the squeegee. Preferably, the squeegee is put in contact with the printing plate, the pushing pressure is 0.14 to 0.175 MPa, using compressed air, and the moving speed is 30 to 300 mm/sec. After the printing, baking is performed for five minutes at 120 to 160° C. The baking may be performed in an indirect heating atmosphere.

Figure 3C:
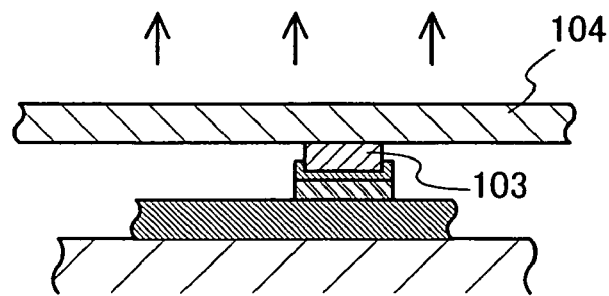

After that, the conductive film 103 hold by the transposing base substance 104, manufactured according to Embodiment Mode 1, and the IC chip 1140 are bonded (FIG. 3C). In this embodiment mode, a pressure 147 N is applied to the substrate 101 in a condition where the anisotropic conductive resin is 140° C., and that condition is kept for 20 seconds, so that the IC chip 1140 and the conductive film 103 are joined.

After that, the transposing base substance 104 is peeled from the IC chip 1140, and as a result, the conductive film 103 and the transposing base substance 104 are peeled from each other. Then, a protective film which is a film formed of polypropylene, polyester, vinyl, polyvinyl fluoride, vinyl chloride or the like, paper made of a fibrous material, a laminated film of a base material film (polyester, polyamide, an inorganic deposition film, paper or the like) and an adhesive synthetic resin film (an acrylic-based synthetic resin, an epoxy-based synthetic resin or the like) or the like is formed over the conductive film 103. In this manner, the semiconductor device shown in FIG. 3A can be manufactured.

By using a wiring board manufactured according to Embodiment Mode 1 for a semiconductor device, the semiconductor device can be manufactured at low cost by a simple process, without performing complicated steps many times. It is to be noted that the condition in which a conductive resin or an anisotropic conductive resin is formed by a screen printing method is not limited to the condition shown in this embodiment mode, and any condition can be used as long as a desired conductive resin or anisotropic conductive resin is formed. This embodiment mode can be implemented freely combining with other embodiment modes. That is, the materials and the forming methods described in other embodiment modes can be used freely combining with this embodiment mode.

Embodiment Mode 3

In this embodiment mode, one mode of using a conductive film shown in the above-described embodiment mode for a semiconductor device will be described in detail with reference to drawings. In more detail, a manufacturing method of a semiconductor device including an IC chip including at least one thin film transistor and at least one memory element, and an antenna, will be described with reference to drawings. It is to be noted in this embodiment mode that a thin film transistor is an element constituting each circuit such as an asynchronous counter or a power supply circuit included in a semiconductor device.

Figure 4A:
FIGS. 4A to 4C are views showing a manufacturing method of a semiconductor device of the invention.

A peeling layer 702 is formed over one surface of a substrate 701 (also referred to as a base substance) (FIG. 4A). The substrate 701 has an insulating surface. As the substrate 701, a glass substrate such as barium borosilicate glass or alumino borosilicate glass, a quartz substrate, a ceramic substrate, a silicon substrate, a metal substrate including stainless-steel, or the like can be used. Besides, a substrate made of a flexible synthetic resin such as plastic typified by polyethylene terephthalate (PET), polyethylene naphthalate (PEN), and polyether sulfone (PES), or acrylic can be used. When the substrate 701 is formed of glass, the area and shape are not particularly limited. Accordingly, when, for example, a rectangular substrate with a side of one meter or more is used as the substrate 701, productivity can be significantly improved. When the substrate 701 is formed of plastic, it is necessary to use heat-resistant plastic which can resist the treatment temperature of the manufacturing process. Preferably, after at least one thin film transistor is provided over the substrate 701 formed of glass, the thin film transistor may be peeled off and provided over a plastic substrate.

Although the peeling layer 702 is formed over the entire surface of the substrate 701 in the aforementioned step, the peeling layer provided over the entire surface of the substrate 701 may be patterned by a photolithography method to be selectively provided, if necessary. Furthermore, although the peeling layer 702 is formed in contact with the substrate 701, an insulating layer may be formed as a base in contact with the substrate 701 as needed, and the peeling layer 702 may be formed in contact with the insulating layer.

In order to obtain the peeling layer 702, a single layer or a laminated layer is formed by a sputtering method, a plasma CVD method or the like, using an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), silicon (Si) and the like, or an alloy material or a compound material containing the above-described element as its main component. The crystal structure of the layer containing silicon may be any of an amorphous structure, a microcrystalline structure, and a polycrystalline structure.

Next, an insulating layer 703 is formed as a base so as to cover the peeling layer 702. In order to obtain the insulating layer 703, a single layer or a laminated layer including an oxide of silicon or a nitride of silicon is formed by a sputtering method, a plasma CVD method or the like. The oxide of silicon is a substance containing silicon (Si) and oxygen (O), which corresponds to silicon oxide, silicon oxide containing nitrogen, or the like. The nitride of silicon is a substance containing silicon and nitrogen (N), which corresponds to silicon nitride, silicon nitride containing oxygen, or the like. The insulating layer to be a base functions as a blocking film to prevent impurities from entering from the substrate 701.

Figure 4B:
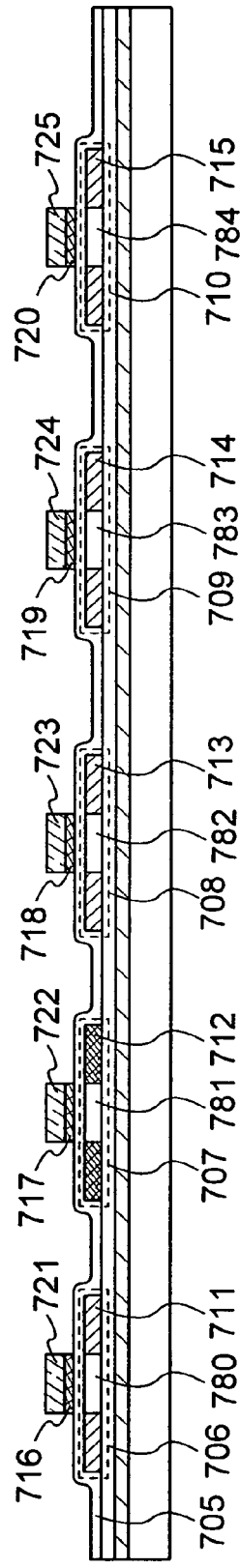

Next, an amorphous semiconductor layer 704 is formed over the insulating layer 703. The amorphous semiconductor layer 704 is formed by a sputtering method, an LPCVD method, a plasma CVD method or the like. Subsequently, the amorphous semiconductor layer 704 is crystallized by a laser crystallization method, a thermal crystallization method using RTA or an annealing furnace, a thermal crystallization method using a metal element promoting crystallization, a laser crystallization method combined with the thermal crystallization method using a metal element promoting crystallization, or the like to form a crystalline semiconductor layer. Then, the obtained crystalline semiconductor layer is patterned into a desired shape, thereby crystalline semiconductor layers 706 to 710 are formed (FIG. 4B).

An example of a manufacturing step of the crystalline semiconductor layers 706 to 710 will be described hereinafter. First, an amorphous semiconductor layer 704 is formed by a plasma CVD method. Next, a solution containing nickel that is a metal element for promoting crystallization is retained onto the amorphous semiconductor layer, and a dehydrogenation treatment (at 500° C., for one hour) and a thermal crystallization treatment (at 550° C., for four hours) are performed on the amorphous semiconductor layer, thereby a crystalline semiconductor layer is formed. After that, the crystalline semiconductor layer is irradiated with laser beam as needed, and a patterning treatment using a photolithography method is performed to form the crystalline semiconductor layers 706 to 710.

In the case of using a laser crystallization method for crystallizing the amorphous semiconductor film, a continuous wave laser beam (a CW laser beam) or a pulsed laser beam may be used. As a laser beam which can be used here, a laser emitted from one or a plurality of the following: a gas laser such as an Ar laser, a Kr laser or an excimer laser; a laser of which the medium is single crystalline YAG, $YVO_4$, forsterite ($Mg_2SiO_4$), $YAlO_3$, $GdVO_4$, or polycrystalline (ceramic) YAG, $Y_2O_3$, $YVO_4$, $YAlO_3$, $GdVO_4$, each added with one or more of Nd, Yb, Cr, Ti, Ho, Er, Tm and Ta as a dopant; a glass laser; a ruby laser; an alexandrite laser; a Ti: sapphire laser; a copper vapor laser; a gold vapor laser and the like, can be used. It is possible to obtain crystals with a large grain size when a fundamental wave of such laser beams or second to fourth harmonics of the fundamental wave are used. For example, the second harmonic (532 nm) or the third harmonic (355 nm) of an Nd: $YVO_4$ laser (fundamental wave of 1064 nm) can be used. In this case, the energy density of a laser of about 0.01 to 100 $MW/cm^2$ (preferably, 0.1 to 10 $MW/cm^2$) is required. The scanning rate is set to be about 10 to 2000 cm/sec to irradiate the semiconductor film.

It is to be noted that, a laser of which the medium is single crystalline YAG, $YVO_4$, forsterite ($Mg_2SiO_4$), $YAlO_3$, or $GdVO_4$ or polycrystalline (ceramic) YAG, $Y_2O_3$, $YVO_4$, $YAlO_3$, or $GdVO_4$, each added with one or more of Nd, Yb, Cr, Ti, Ho, Er, Tm, and Ta as a dopant; an Ar ion laser; or a Ti: sapphire laser can be continuously oscillated. Furthermore, pulse oscillation thereof can be performed with an oscillation frequency of 10 MHz or more by carrying out Q switch operation or mode synchronization. When a laser beam is oscillated with an oscillation frequency of 10 MHz or more, a semiconductor film is irradiated with a next pulse while the semiconductor film is melted by the laser beam and then is solidified. Therefore, differing from a case of using a pulsed laser with a low repetition rate, a solid-liquid interface can be continuously moved in the semiconductor film, so that crystal grains, which continuously grow toward a scanning direction, can be obtained. By irradiating the semiconductor film with a continuous wave laser or a laser beam oscillated with a frequency of 10 MHz or more, a surface of the crystallized semiconductor film can be flat. Because of this, it is possible to make a gate insulating film to be formed later as a thin film, and voltage resistance of the gate insulating film can be improved.

When ceramic (polycrystal) is used as a medium, the medium can be formed to have a free shape for a short amount of time at low cost. When using a single crystal, a columnar medium with several mm in diameter and several tens of mm in length is usually used. However, in the case of using the ceramic, a medium bigger than the case of using the single crystal can be formed.

A concentration of a dopant such as Nd or Yb in a medium, which directly contributes to light emission, cannot be changed largely in both cases of the single crystal and the polycrystal, and therefore, there is a limitation to some extent in improvement in output of a laser by increasing the concentration. However, in the case of the ceramic, the size of a medium can be significantly increased as compared with the case of the single crystal, and therefore, drastic improvement in output of a laser can be expected.

Furthermore, in the case of the ceramic, a medium with a parallelepiped shape or a rectangular parallelepiped shape can be easily formed. In a case of using a medium having such a shape, when oscillated light is made to zigzag inside of the medium, a long path of the oscillated light can be obtained. Therefore, amplification is increased and a laser beam can be oscillated at high output. Furthermore, a cross-sectional shape of a laser beam emitted from a medium having such a shape is a quadrangular shape, and therefore, as compared with a laser beam with a circular shape, the laser beam with the quadrangular shape in cross section has an advantage to be shaped into a linear beam. By shaping a laser beam emitted in the above-described manner using an optical system, a linear beam with 1 mm or less in length of a short side and several mm to several m in length of a long side can be easily obtained. In addition, when a medium is uniformly irradiated with excited light, a linear beam is emitted with uniform energy distribution in a long side direction.

When a semiconductor film is irradiated with such a linear beam, an entire surface of the semiconductor film can be uniformly annealed. In the case where uniform annealing is required from one end to the other end of a linear beam, an ingenuity in which slits are disposed on the both ends of the linear beam so as to shield the portion with attenuated energy, or the like is required. When an electronic apparatus is manufactured using a semiconductor film crystallized by using a linear beam with uniform strength obtained in the above-described manner, characteristics of the electronic apparatus are excellent and uniform.

In addition, when the crystallization of the amorphous semiconductor layer is performed by using the metal element for promoting crystallization, it is advantageous in that the crystallization can be performed at low temperature in a short amount of time, and that the direction of crystals becomes uniform. On the other hand, there is a problem that the property is not stable because the off current is increased due to the remaining metal element in the crystalline semiconductor layer. Therefore, it is preferable to form an amorphous semiconductor layer functioning as a gettering site over the crystalline semiconductor layer. In order to form a gettering site, the amorphous semiconductor layer is required to contain an impurity element such as phosphorus or argon, and therefore, it is preferably formed by a sputtering method by which argon can be contained at a high concentration. After that, a heat treatment (an RTA method, thermal annealing using an annealing furnace, or the like) is performed to diffuse the metal element into the amorphous semiconductor layer, and then the amorphous semiconductor layer containing the metal element is removed. In this manner, the contained amount of the metal element in the crystalline semiconductor layer can be reduced or the metal element can be removed.

Next, a gate insulating layer 705 covering the crystalline semiconductor layers 706 to 710 is formed. As the gate insulating layer 705, a single layer or a laminated layer of a layer containing an oxide of silicon or a nitride of silicon is formed by a plasma CVD method, a sputtering method, or the like.

An oxide film or a nitride film may be formed over a surface of the crystalline semiconductor films 706 to 710 by a high-density plasma treatment, before forming the gate insulating layer 705. For example, in the case where Si is used for the crystalline semiconductor films 706 to 710, silicon oxide ($SiO_x$) or silicon nitride ($SiN_x$) is formed on the semiconductor film surface. Furthermore, the semiconductor film may be oxidized by a high-density plasma treatment and then nitrided by performing a plasma treatment again. In this case, a silicon oxide (SiO$_x$) is formed in contact with the semiconductor film and silicon nitride oxide (SiN$_x$O$_y$) (x>y) is formed on the surface of the silicon oxide.

In the case where the semiconductor film is oxidized by a plasma treatment, the plasma treatment is performed in an atmosphere including oxygen (for example, an atmosphere including oxygen (O$_2$) and a rare gas (including at least one of He, Ne, Ar, Kr, and Xe); an atmosphere including oxygen, hydrogen (H$_2$) and a rare gas; or an atmosphere including dinitrogen monoxide and a rare gas). On the other hand, in the case where the semiconductor film is nitrided by a plasma treatment, the plasma treatment is performed in an atmosphere including nitrogen (for example, an atmosphere including nitrogen (N$_2$) and a rare gas (including at least one of He, Ne, Ar, Kr, and Xe); an atmosphere including nitrogen, hydrogen and a rare gas; or an atmosphere including NH$_3$ and a rare gas). As the rare gas, Ar can be used, for example. Alternatively, a mixed gas of Ar and Kr may be used. The rare gas (including at least one of He, Ne, Ar, Kr, and Xe) used for the plasma treatment is contained in the insulating film formed by the plasma treatment. In the case of using Ar, for example, Ar is contained in the insulating film formed by the plasma treatment. When excitation of the plasma in this case is performed by introduction of a microwave, high density plasma with low electron temperature can be generated. By an oxygen radical (an OH radical may be included) or a nitrogen radical (an NH radical may be included) generated in this high-density plasma, the surface of the semiconductor film can be oxidized or nitrided.

The high-density plasma treatment is performed with the electron density of $1 \times 10^{11}$ cm$^3$ or more and the electron temperature of plasma of 1.5 eV or less in the atmosphere containing the gas described above. More specifically, the electron density is $1 \times 10^{11}$ cm$^{-3}$ or more but $1 \times 10^{13}$ cm$^{-3}$ or less, and the electron temperature of plasma is 0.5 eV or more but 1.5 eV or less. The electron density of plasma is high and the electron temperature around a treatment object (here, the semiconductor film) formed over the substrate is low. Thus, damages by plasma to the treatment object can be avoided. In addition, since the plasma electron density is as high as $1 \times 10^{11}$ cm$^{-3}$ or more, the oxide film or the nitride film formed by oxidizing or nitriding the treatment object by using the plasma treatment has a superior uniformity of film thickness as compared with a film formed by a CVD method, a sputtering method or the like; and thus, can be a dense film. In addition, since the electron temperature of the plasma is as low as 1.5 eV or less, the oxidation treatment or the nitriding treatment can be performed at a lower temperature than a conventional plasma treatment or thermal oxidation method. For example, the oxidation treatment or the nitriding treatment can be performed sufficiently, even when the plasma treatment is performed at a temperature lower than a strain point of a glass substrate by at least 100° C. As the frequency for generating plasma, a high frequency wave such as a micro wave (2.45 GHz) can be used. It is to be noted that the above-described conditions are used for a plasma treatment, if not otherwise specified hereinafter.

By a treatment using such high-density plasma, an insulating film with a thickness of 1 to 20 nm, typically 5 to 10 nm, is formed over the semiconductor film. Since the reaction of this case is a solid-phase reaction, an interface state density between the insulating film and the semiconductor film can be extremely low. Since a high-density plasma treatment like this oxidizes (or nitrides) a semiconductor film (crystalline silicon, or polycrystalline silicon) directly, unevenness of a thickness of the formed insulating film can be extremely small, ideally. In addition, oxidation is not strengthened even in a grain boundary of crystalline silicon, which makes a very preferable condition. That is, by solid-phase oxidation of the surface of the semiconductor film by the high-density plasma treatment described here, an insulating film with high uniformity and low interface state density can be formed without causing oxidation reaction abnormally in a grain boundary.

In the case where the film thickness of the insulating film formed by oxidizing or nitriding the semiconductor film by a plasma treatment is thick enough, the gate insulating layer 705 is not necessarily provided, and the insulating film formed on the semiconductor film surface by the plasma treatment may be used as a gate insulating film. As the gate insulating film, an insulating film formed by the high-density plasma treatment can be used alone, or an insulating film of silicon oxide, silicon oxynitride, silicon nitride or the like may be deposited thereover by a CVD method using plasma or thermal reaction, so as to make a laminated layer. In any case, a transistor including the insulating film formed by high-density plasma, in part of the gate insulating film or as a whole gate insulating film, can reduce variation in the property.

Furthermore, a semiconductor film obtained by crystallizing the semiconductor film by irradiating it with a continuous wave laser or a laser beam oscillated with a frequency of 10 MHz or more, scanning in one direction, has a property that the crystal grows in the scanning direction of the beam. When a transistor is placed so that the scanning direction is aligned with the channel length direction (the direction in which carriers flow when a channel forming region is formed) and a gate insulating layer formed by the above-described high-density plasma is used, a transistor (TFT) with fewer variation in property and high electron field-effect mobility can be obtained.

Next, a first conductive layer and a second conductive layer are formed laminated over the gate insulating layer 705. The first conductive layer is formed with a thickness of 20 to 100 nm by a plasma CVD method or a sputtering method, and the second conductive layer is formed with a thickness of 100 to 400 nm. The first conductive layer and the second conductive layer are formed of an element selected from tantalum (Ta), tungsten (W), titanium (Ti), molybdenum (Mo), aluminum (Al), copper (Cu), chromium (Cr) and the like, or an alloy material or a compound material containing the above-described element as its main component. Alternatively, they are formed of a semiconductor material typified by polycrystalline silicon doped with an impurity element such as phosphorus. As examples of a combination of the first conductive layer and the second conductive layer, a tantalum nitride layer and a tungsten layer, a tungsten nitride layer and a tungsten layer, a molybdenum nitride layer and a molybdenum layer, and the like can be given. Since tungsten and tantalum nitride have high heat resistance, a heat treatment for thermal activation can be performed after the first conductive layer and the second conductive layer are formed. In addition, in the case of employing a three-layer structure instead of a two-layer structure, a laminated structure of a molybdenum layer, an aluminum layer and a molybdenum layer is preferably adopted.

Next, a resist mask is formed by a photolithography method, and an etching treatment for forming a gate electrode and a gate line is performed, so that conductive layers 716 to 725 functioning as gate electrodes are formed.

Next, a resist mask is formed by a photolithography method, and an impurity element imparting N-type conductivity is added at a low concentration to the crystalline semiconductor layers 706 and 708 to 710, by an ion doping method or an ion implantation method, so that impurity regions 711 and 713 to 715, and channel-forming regions 780 and 782 to 784 are formed. As the impurity element imparting N-type conductivity, an element which belongs to Group 15 may be used; for example, phosphorus (P) or arsenic (As) is used.

Next, a resist mask is formed by a photolithography method, and an impurity element imparting P-type conductivity is added to the crystalline semiconductor layer 707, so that an impurity region 712 and a channel-forming region 781 are formed. As the impurity element imparting P-type conductivity, boron (B) is used, for example.

Figure 4C:
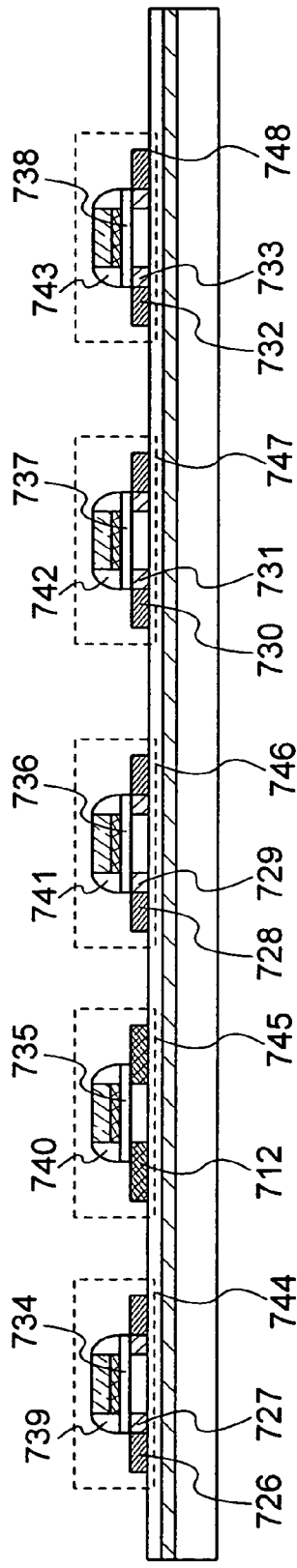

Next, an insulating layer is formed so as to cover the gate insulating layer 705 and the conductive layers 716 to 725. The insulating layer is formed as a single layer or a laminated layer of a layer containing an inorganic material such as silicon, an oxide of silicon, or a nitride of silicon, or an organic material such as an organic resin or the like, by a plasma CVD method or a sputtering method. Next, the insulating layer is selectively etched by anisotropic etching mainly in a vertical direction, so that insulating layers (also referred to as side walls) 739 to 743 which are in contact with the side surfaces of the conductive layers 716 to 725 are formed (FIG. 4C). Furthermore, simultaneously with the manufacture of the insulating layers 739 to 743, insulating layers 734 to 738 are formed by etching the insulating layer 705. The insulating layers 739 to 743 are used as masks for doping when LDD (Lightly Doped drain) regions are formed later.

Next, a resist mask is formed by a photolithography method, and by using the resist mask and the insulating layers 739 to 743 as masks, an impurity element imparting N-type conductivity is added to the crystalline semiconductor layers 706 and 708 to 710, so that first impurity regions (also referred to as LDD regions) 727, 729, 731 and 733, and second impurity regions 726, 728, 730 and 732 are formed. Concentration of the impurity element contained in the first impurity regions 727, 729, 731 and 733 is lower than concentration of the impurity element contained in the second impurity regions 726, 728, 730 and 732. Through the above-described steps, N-channel type thin film transistors 744 and 746 to 748 and a P-channel type thin film transistor 745 are completed.

Figure 10A:
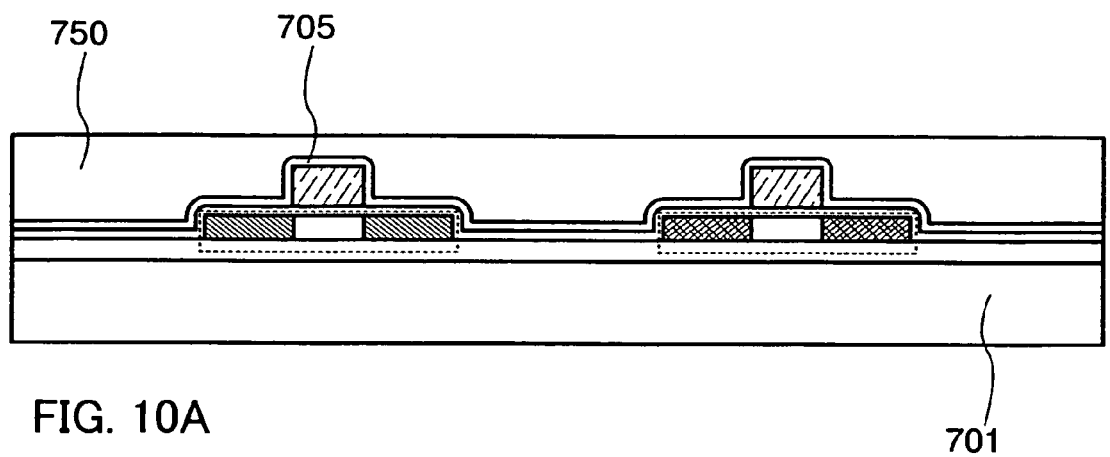
FIGS. 10A to 10C are views showing modes of a thin film transistor.
Figure 10B:
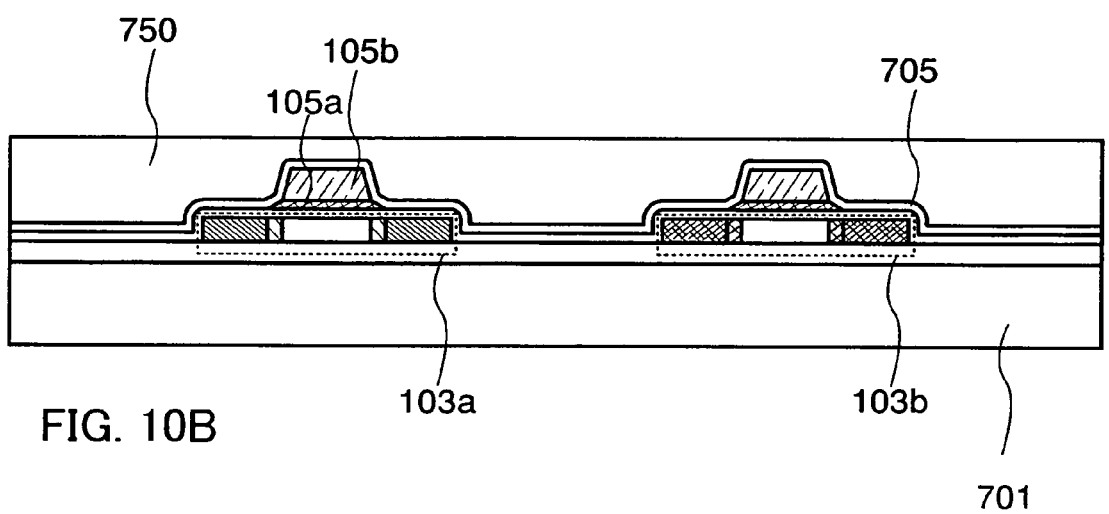
Figure 10C:
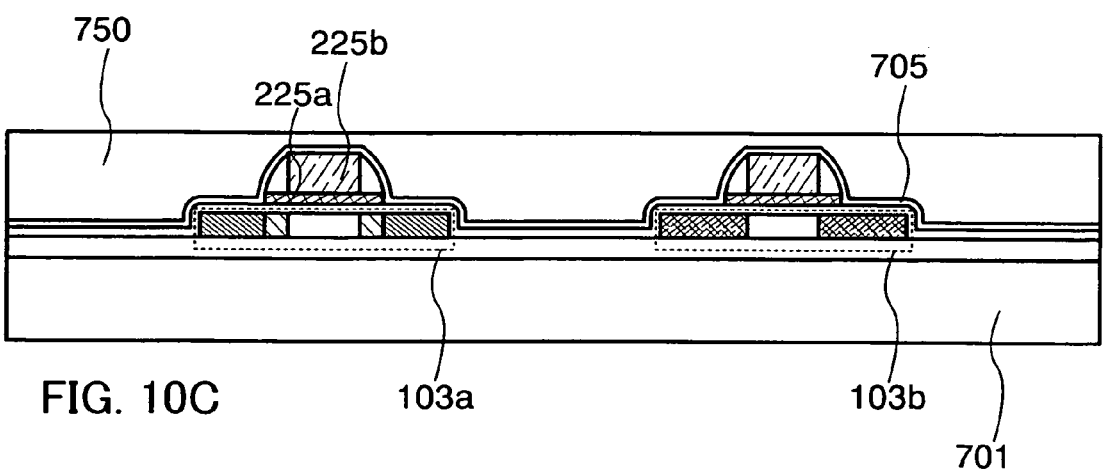

It is to be noted that a structure of the thin film transistor is not limited to the description above. Any structure such as a single-drain structure, an off-set structure, an LDD structure, or a GOLD (Gate Overlapped Lightly Doped drain) structure may be adopted. For example, an LDD region may be provided in every transistor, or an LDD region or a side wall may be provided in no transistor (FIG. 10A). Furthermore, a structure of the thin film transistor is not limited to the above-described structures, and TFT of a single gate structure in which one channel forming region is formed, or a multi gate structure having a plurality of channel forming regions such as a double gate structure in which two channel forming regions are formed or a triple gate structure in which three channel forming regions are formed can be used. In addition, a bottom gate type (inversely staggered type) may be adopted, or a dual gate type having two gate electrodes placed above and below a channel forming region, with gate insulating films therebetween may be adopted. Furthermore, the gate electrode can be provided in a laminated structure. In the case of providing a gate electrode in a laminated structure, the following structure may be adopted as shown in FIG. 10B: a first conductive film 105a formed in a lower part of the gate electrode and a second conductive film 105b formed over the first conductive film 105a are provided, the first conductive film is formed with a tapered shape, and impurity regions of a lower concentration than that of impurity regions each functioning as a source or a drain region are formed so as to overlap only with the first conductive film. Alternatively, in the case of providing a gate electrode in a laminated structure, the following structure (FIG. 10C) may also be adopted: a first conductive film 225a formed in a lower part of the gate electrode and a second conductive film 225b formed over the first conductive film 225a are provided, and side walls in contact with side surfaces of the second conductive film 225b are formed over the conductive film 225a. In the above-described structures, an impurity region functioning as a source or drain region of the semiconductor films 103a and 103b can be provided using a silicide of Ni, Co, W or the like.

Figure 5A:
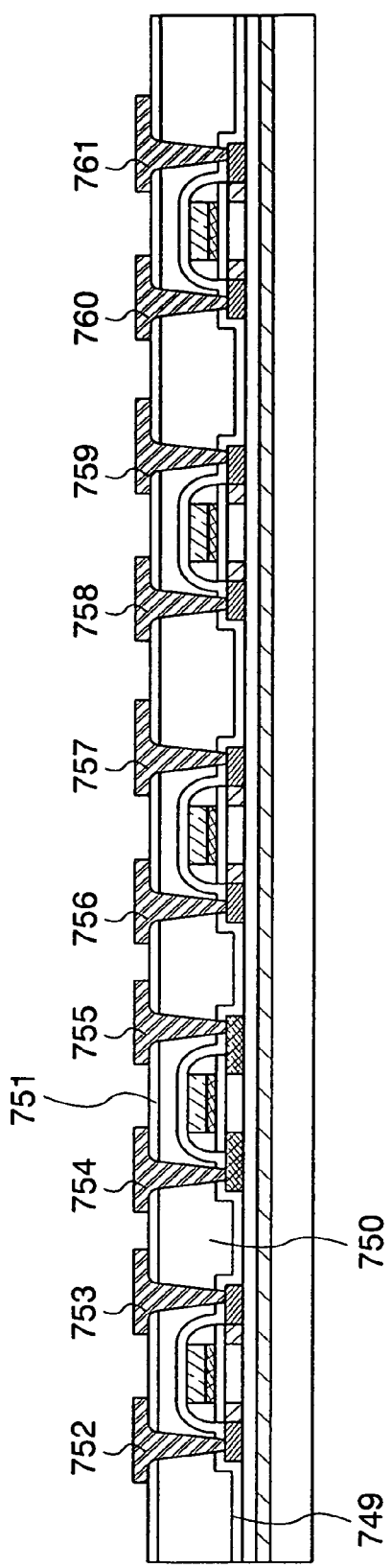
FIGS. 5A and 5B are views showing a manufacturing method of a semiconductor device of the invention.

Subsequently, an insulating layer is formed as a single layer or a laminated layer so as to cover the thin film transistors 744 to 748 (FIG. 5A). The insulating layer covering the thin film transistors 744 to 748 is formed as a single layer or a laminated layer using an inorganic material such as an oxide of silicon or a nitride of silicon, an organic material such as polyimide, polyamide, benzocyclobutene, acrylic, epoxy or siloxane, or the like, by an SOG method, a droplet discharging method, or the like. Siloxane corresponds to a resin including an Si—O—Si bond. Siloxane includes a skeleton structure of a bond of silicon (Si) and oxygen (O). As a substituent, an organic group including at least hydrogen (an alkyl group, or an aromatic hydrocarbon, for example) is used. In addition, a fluoro group may be used as a substituent.

For example, in the case where the insulating layer covering the thin film transistors 744 to 748 has a three-layer structure, a layer containing silicon oxide may be formed as a first insulating layer 749, a layer containing a resin may be formed as a second insulating layer 750, and a layer containing silicon nitride may be formed as a third insulating layer 751.

It is to be noted that before the insulating layers 749 to 751 are formed or after one or more of the insulating layers 749 to 751 are formed, a heat treatment for recovering the crystallinity of the semiconductor layer, for activating the impurity element which has been added into the semiconductor layer, or for hydrogenating the semiconductor layer is preferably performed. For the heat treatment, a thermal annealing method, a laser annealing method, an RTA method, or the like is preferably adopted.

Next, the insulating layers 749 to 751 are etched by a photolithography method, thereby openings are formed to expose the second impurity regions 726, 728, 730 and 732 and the impurity region 712. Subsequently, a conductive layer is formed so as to fill the openings and patterned to form conductive layers 752 to 761 each functioning as a source wiring or a drain wiring.

The conductive layers 752 to 761 are formed as a single layer or a laminated layer using an element selected from titanium (Ti), aluminum (Al), neodymium (Nd) and the like, or an alloy material or a compound material containing the above-described element as its main component by a plasma CVD method or a sputtering method. An alloy material containing aluminum as its main component corresponds to, for example, a material containing nickel whose main component is aluminum, a material containing silicon whose main component is aluminum, or a material containing one or more selected from nickel, carbon and silicon whose main component is aluminum. Each of the conductive layers 752 to 761 preferably employs, for example, a laminated structure of a barrier layer, an aluminum layer containing silicon, and a barrier layer; or a laminated structure of a barrier layer, an aluminum layer containing silicon, a titanium nitride layer, and a barrier layer. It is to be noted that the silicon contained in the aluminum-silicon is 0.1 wt % to 5 wt %. In addition, a barrier layer corresponds to a thin film formed by using titanium, a nitride of titanium, molybdenum, or a nitride of molybdenum. Since aluminum and aluminum containing silicon have low resistance and are inexpensive, they are optimal materials for forming the conductive layers 752 to 761. In addition, generation of a hillock of aluminum or aluminum containing silicon can be prevented when upper and lower barrier layers are provided. Furthermore, when the barrier layer is formed by using titanium that is a highly-reducible element, even if a thin natural oxide film is formed over the crystalline semiconductor layer, the natural oxide film is reduced and poor connection between the crystalline semiconductor layer and the barrier layer can be restrained.

Figure 5B:
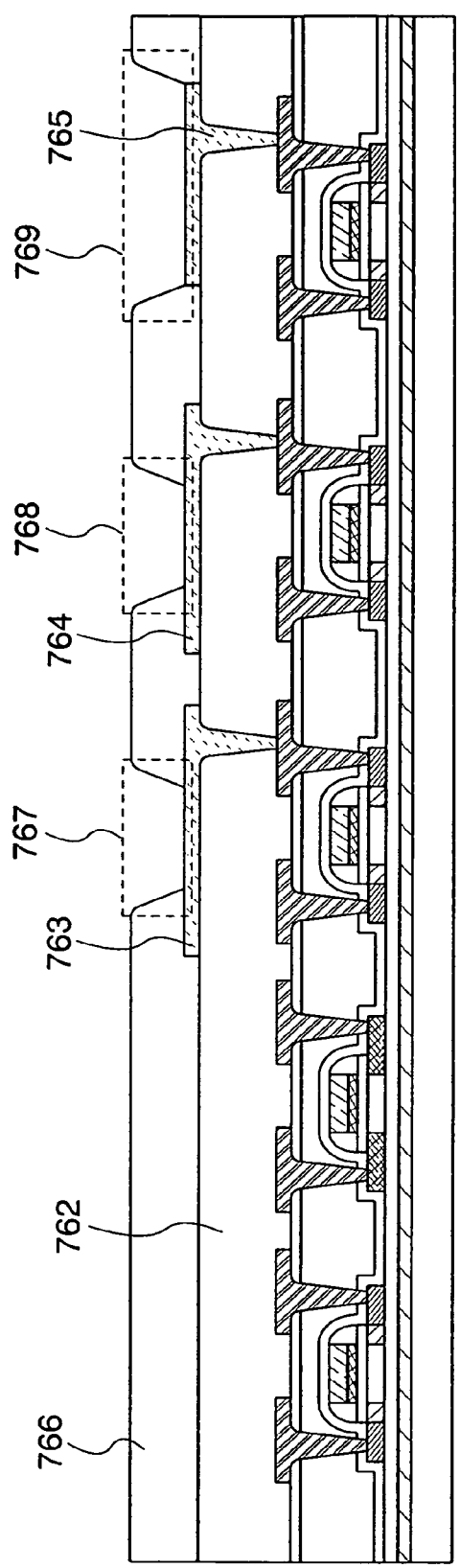

Next, an insulating layer 762 is formed so as to cover the conductive layers 752 to 761 (FIG. 5B). The insulating layer 762 is formed as a single layer or a laminated layer using an inorganic material or an organic material by an SOG method, a droplet discharging method, or the like. The insulating layer 762 is preferably formed with a thickness of 0.75 to 3 µm.

Subsequently, the insulating layer 762 is etched by a photolithography method, so that openings to expose the conductive layers 757, 759 and 761 are formed. Then, a conductive layer is formed so as to fill the openings. The conductive layer is formed by a plasma CVD method or a sputtering method, by using a conductive material. Then, the conductive layer is patterned to form conductive layers 763 to 765. It is to be noted that each of the conductive layers 763 and 764 becomes one of a pair of conductive layers included in a memory element. Therefore, the conductive layers 763 to 765 are preferably formed as single layers or laminated layers using titanium, or an alloy material or a compound material containing titanium as its main component. Titanium has low resistance, which leads to miniaturization of a memory element size, and high integration can be realized. In addition, in the photolithography step for forming the conductive layers 763 to 765, it is preferable to perform wet etching in order to prevent damage to the thin film transistors 744 to 748 in lower layers, and hydrogen fluoride or an ammonia peroxide mixture is preferably used as an etchant.

Next, an insulating layer 766 is formed so as to cover the conductive layers 763 to 765. The insulating layer 766 is formed as a single layer or a laminated layer using an inorganic material or an organic material by an SOG method, a droplet discharging method, or the like. The insulating layer 766 is preferably formed with a thickness of 0.75 to 3 µm. Subsequently, the insulating layer 766 is etched by a photolithography method, and openings 767 to 769 to expose the conductive layers 763 to 765 are formed.

Figure 6A:
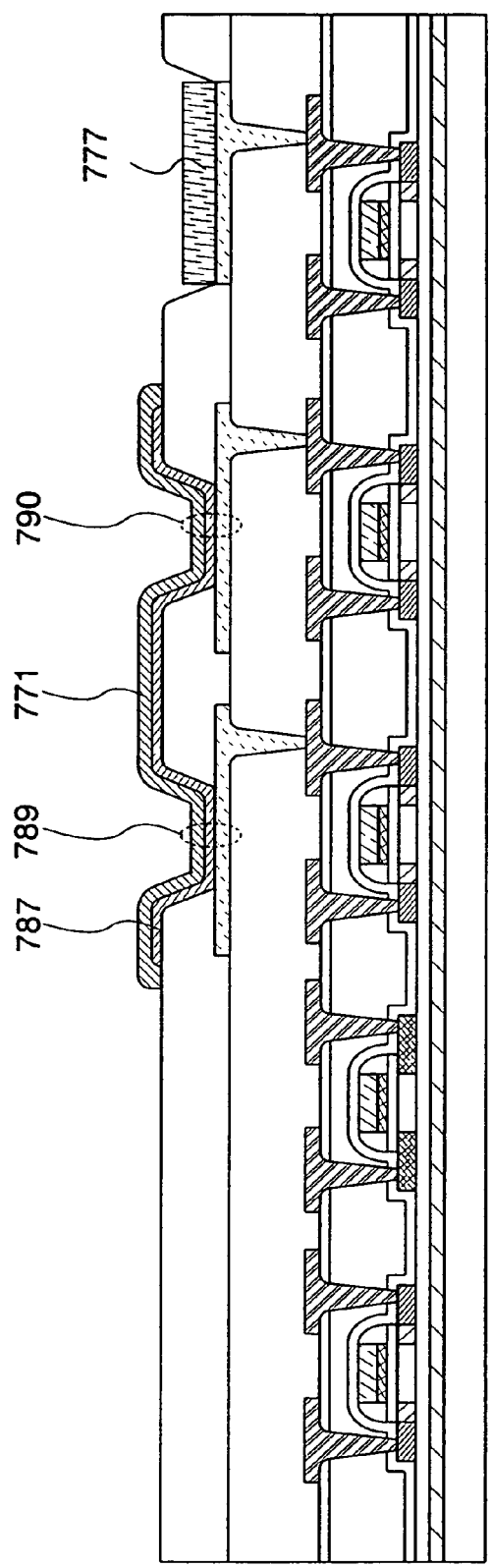
FIGS. 6A and 6B are views showing a manufacturing method of a semiconductor device of the invention.

Next, a layer 787 which contains an organic compound is formed in contact with the conductive layers 763 and 764 (FIG. 6A). The layer 787 which contains an organic compound is formed by a droplet discharging method, a deposition method or the like. Subsequently, a conductive layer 771 is formed in contact with the layer 787 which contains an organic compound. The conductive layer 771 is formed by a sputtering method, a deposition method or the like.

Through the above-described steps, a memory element 789 including a laminated body of the conductive layer 763, the layer 787 which contains an organic compound and the conductive layer 771, and a memory element 790 including a laminated body of the conductive layer 764, the layer 787 which contains an organic compound and the conductive layer 771 are completed. By this step, an IC chip included in a semiconductor device can be formed. It is to be noted that a mode of the memory element is not limited to this embodiment mode, and the memory element is not necessarily provided if it is not needed.

Figure 6B:
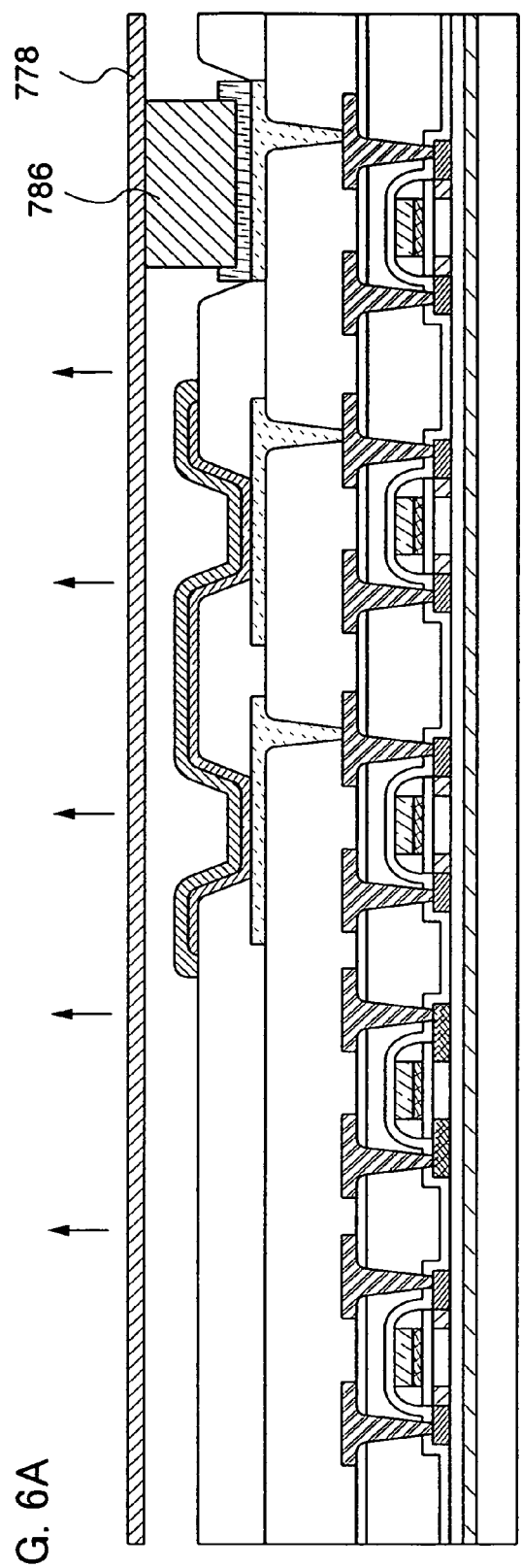

Next, an anisotropic conductive resin 777 is formed over the conductive layer 765. Then, a support 778 on which a conductive film 786 manufactured in the same way as the above-described embodiment mode is provided is placed over the anisotropic conductive resin 777. It is to be noted that the conductive film 786 is a wiring board functioning as an antenna. Then, by removing the support 778, the support 778 and the conductive film 786 are peeled from each other (FIG. 6B and FIG. 7A).

Next, an insulating layer 772 functioning as a protective layer is formed so as to cover the memory elements 789 and 790 and the conductive layer 786 by an SOG method, a droplet discharging method or the like (FIG. 7B). The insulating layer 772 is formed of a layer containing carbon such as DLC (diamond like carbon), a layer containing silicon nitride, a layer containing silicon nitride oxide, or an organic material (preferably an epoxy resin).

Figures 8A, 8B:
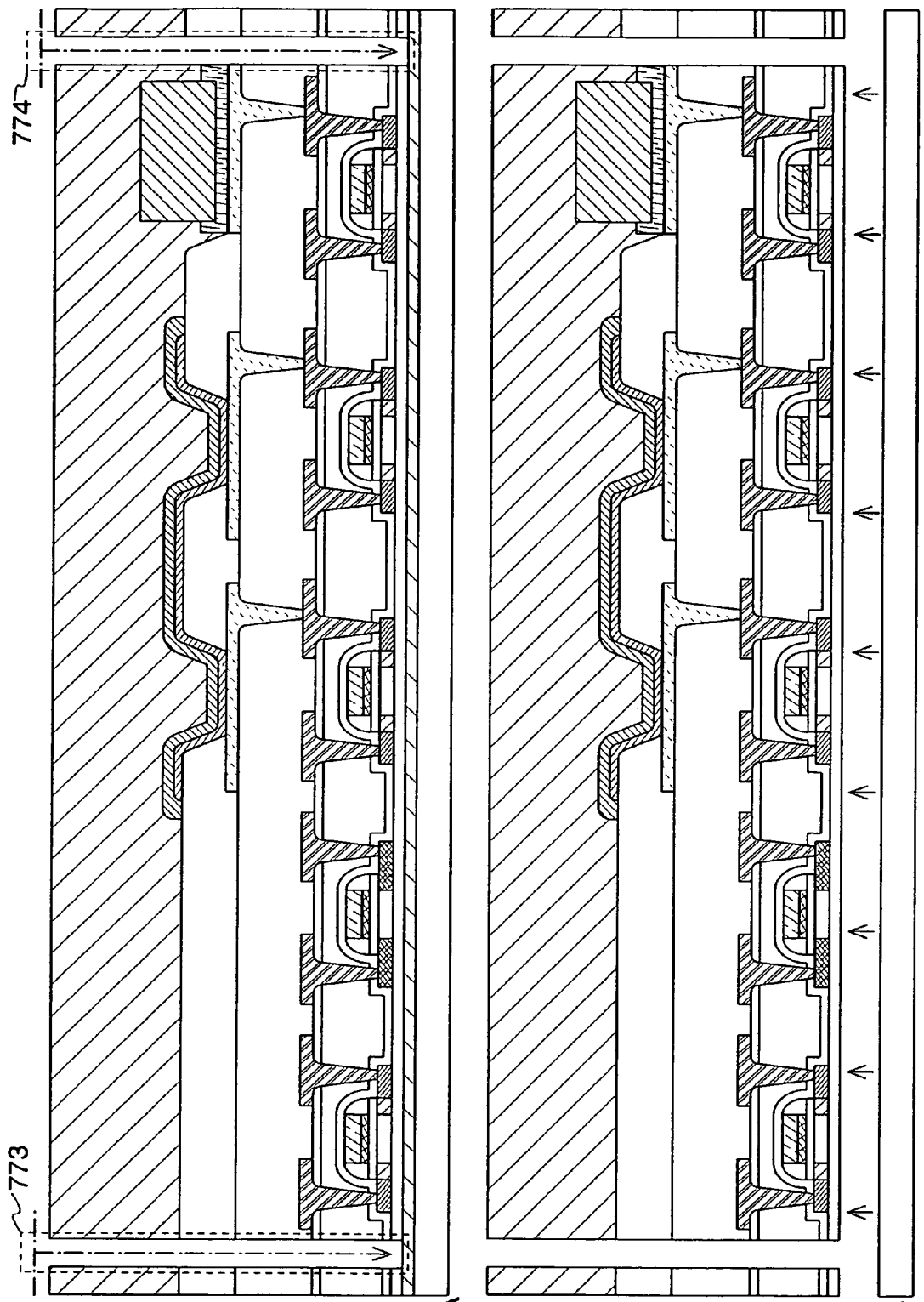
FIGS. 8A and 8B are views showing a manufacturing method of a semiconductor device of the invention.

Next, the insulating layers 703, 749, 750, 751, 762, 766 and 772 are etched so as to expose the peeling layer 702 partially, and openings 773 and 774 are formed (FIG. 8A). The openings 773 and 774 can be formed by a photolithography method or a method in which a needless part is removed using a laser. In this embodiment mode, the openings 773 and 774 are formed by irradiating the insulating layers with a laser beam emitted from an ultraviolet laser.

Next, a thin film integrated circuit portion 799 including the thin film transistors 744 to 748, an element group of the memory elements 789 and 790 and the conductive layer 786 is peeled from the substrate 701. As a method for peeling, there are mainly chemical peeling which removes the peeling layer 702 by etching or the like, and physical peeling which separates the thin film integrated circuit portion 799 and the peeling layer 702 from each other by an action from outside, but not limited thereto. In this embodiment mode, the chemical peeling is used, and an etchant is introduced into the openings 773 and 774 so as to remove the peeling layer 702 (FIG. 8B). As the etchant, a gas or liquid containing halogen fluoride is used. For example, there are chlorine trifluoride ($ClF_3$), nitrogen trifluoride ($NF_3$), bromine trifluoride ($BrF_3$), and hydrogen fluoride (HF). In the case where hydrogen fluoride is used as the etchant, a layer of silicon oxide is used as the peeling layer 702. It is to be noted that the thin film integrated circuit portion 799 may be peeled off by a physical means such as pulling it from outside, instead of removing the peeling layer 702 chemically. In the case where the openings 773 and 774 are formed by a laser, the peeling layer 702 and the thin film integrated circuit portion 799 can be easily peeled from each other, and the thin film integrated circuit portion 799 and the peeling layer can be separated from each other easily only by pulling the thin film integrated circuit portion 799. When such a physical means is used, there is no need to use an expensive chemical, and a semiconductor device can be manufactured at low cost.

It is preferable to reuse the substrate 701 after the thin film integrated circuit portion 799 is peeled off, in order to reduce the cost. In addition, the insulating layer 772 is formed to prevent the thin film integrated circuit from scattering after the peeling layer 702 is removed. The thin film integrated circuit which is small, thin, and light easily scatters after the peeling layer 702 is removed, since it is not attached firmly to the substrate 701. However, by providing the insulating layer 772 over the thin film integrated circuit, the thin film integrated circuit is weighted, and scattering from the substrate 701 can be prevented. In addition, by forming the insulating layer 772, the thin film integrated circuit which is in itself thin and light is prevented from rolling up, and the strength thereof can be ensured to some degree.

Figure 9:
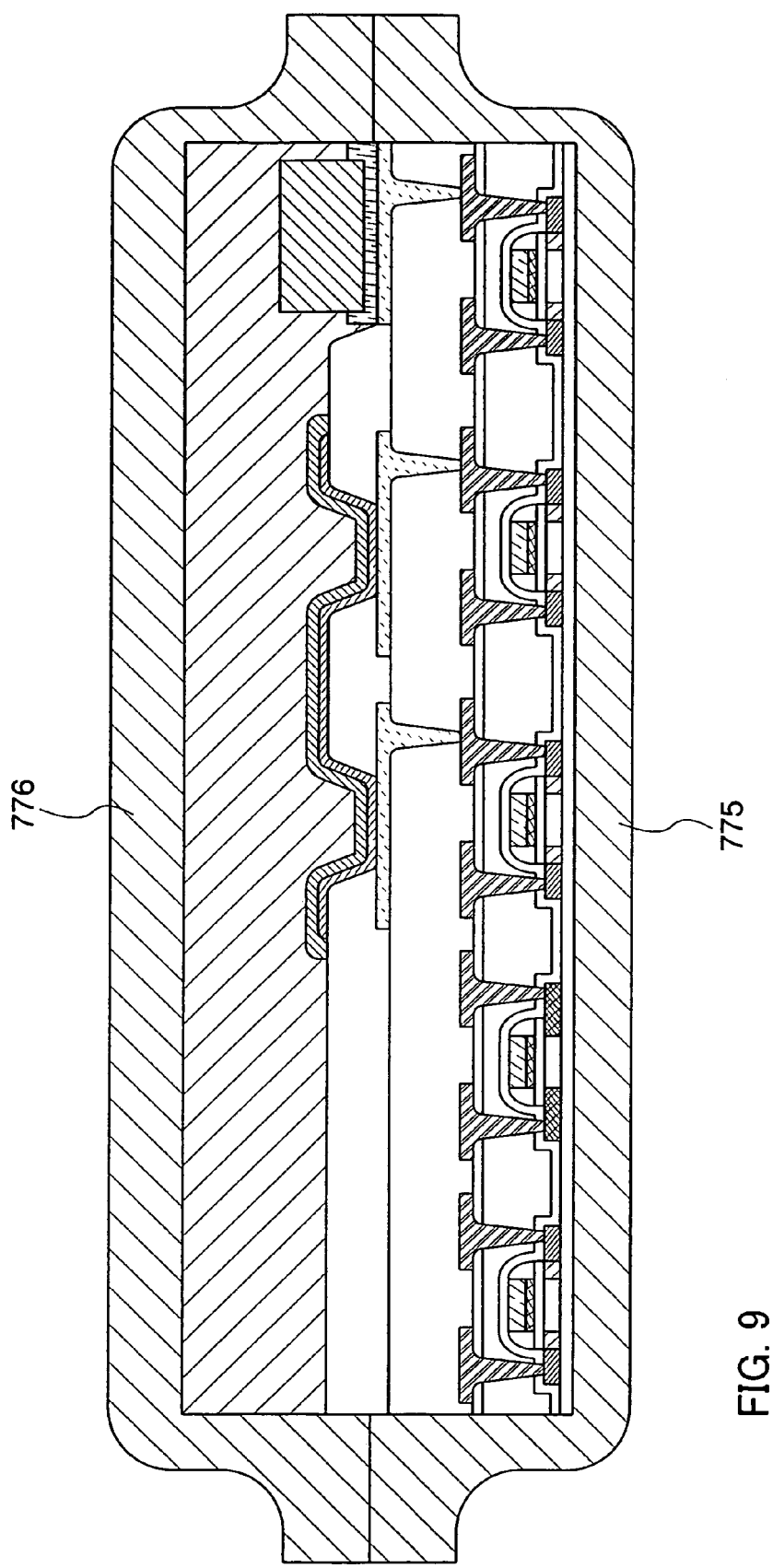
FIG. 9 is a view showing a manufacturing method of a semiconductor device of the invention.

Next, one of the surfaces of the thin film integrated circuit is attached to a first substrate 776, and peeled from the substrate 701 completely (FIG. 9). Subsequently, the other surface of the thin film integrated circuit is attached to a second substrate 775, and one or both of a heat treatment and a pressure treatment are performed so that the thin film integrated circuit is sealed by the first substrate 776 and the second substrate 775. In this manner, a semiconductor device is completed.

The first substrate 776 and the second substrate 775 each correspond to a film to which an antistatic treatment is performed (an antistatic film), a film of polypropylene, polyester, vinyl, polyvinyl fluoride, vinyl chloride or the like, paper made of a fibrous material, a laminated film of a base material film (polyester, polyamide, an inorganic deposition film, paper or the like) and an adhesive synthetic resin film (an acrylic-based synthetic resin, an epoxy-based synthetic resin or the like) or the like. As a film to which an antistatic treatment is performed, a film with an antistatic material dispersed in a resin, a film with an antistatic material attached thereon, and the like can be given as examples. The film with an antistatic material attached thereon may be a film with an antistatic material attached on one of its surfaces, or a film with an antistatic material attached on each of its surfaces. As for the film with an antistatic material attached on one of its surfaces, the antistatic material may be attached to the inner surface of the film or the outer surface of the film. Furthermore, the antistatic material may be attached to the entire surface of the film, or to part of the film. As the antistatic material, a metal such as aluminum, an oxide including indium and tin (ITO), amphoteric metal salt surfactant, imidazoline type amphoteric surfactant, a resin material containing crosslinkable copolymer having a carboxyl group and a quaternary ammonium base on its side chain, and the like can be given as examples. By using antistatic films as the first substrate 776 and the second substrate 775, static electricity from outside can be prevented from having adverse effects on the integrated circuit.

By performing a heat treatment and a pressure treatment, the first substrate 776 and the second substrate 775 are bonded to the treatment object by thermo compression bonding. When the heat treatment and the pressure treatment are performed, an adhesive layer which is provided on the outermost surface of the first substrate 776 and the second substrate 775 each or a layer (not an adhesive layer) which is provided on the outermost layer thereof is melted by the heat treatment, and then pressure is applied, thereby the substrates are bonded. An adhesive layer may be provided on the surface of the first substrate 776 and the second substrate 775 each, or the adhesive layer is not necessarily provided. The adhesive layer corresponds to a layer including an adhesive such as a heat curing resin, an ultraviolet curing resin, a vinyl acetate resin-based adhesive, a vinyl copolymer resin-based adhesive, an epoxy resin-based adhesive, an urethane resin-based adhesive, a rubber-based adhesive, or an acrylic resin-based adhesive.

In the case where the first substrate 776 and the second substrate 775 are formed of plastic which is thin, lightweight, and bendable, they can be easily processed into a good design and flexible shape. Furthermore, in that case, as the semiconductor device is excellent in impact resistance, and can be easily attached to or embedded in various goods, it can be useful in a variety of fields.

In the above-described structure, the memory elements 789 and 790 are each an element in which a layer containing an organic compound is provided between a pair of conductive layers. Data is written to the memory elements 789 and 790 when the pair of conductive layers thereof are short-circuited. Data is read from the memory elements 789 and 790 by reading a difference of a resistance value thereof. Features of the memory elements 789 and 790 includes: they are non-volatile; data thereof cannot be rewritten; and data can be added thereto as long as there are memory elements into which data has not been written yet. Furthermore, the memory elements 789 and 790 can be easily manufactured since each of them has a three-layer laminated body. In addition, since the area of the laminated portion can be easily reduced, high integration can be achieved easily.

By using the wiring board manufactured according to Embodiment Mode 1 for a semiconductor device, a semiconductor device can be manufactured at low cost by a simple process, without performing complicated steps many times. This embodiment mode can be implemented freely combining with other embodiment modes and embodiments. That is, the materials and the forming methods described in other embodiment modes and embodiments can be used freely combining with this embodiment mode.

Embodiment Mode 4

An embodiment mode of a case where a semiconductor device described in the above embodiment mode is used as an RFID which can transmit and receive data without contact will be described with reference to FIGS. 11A to 11C.

Figure 11A:
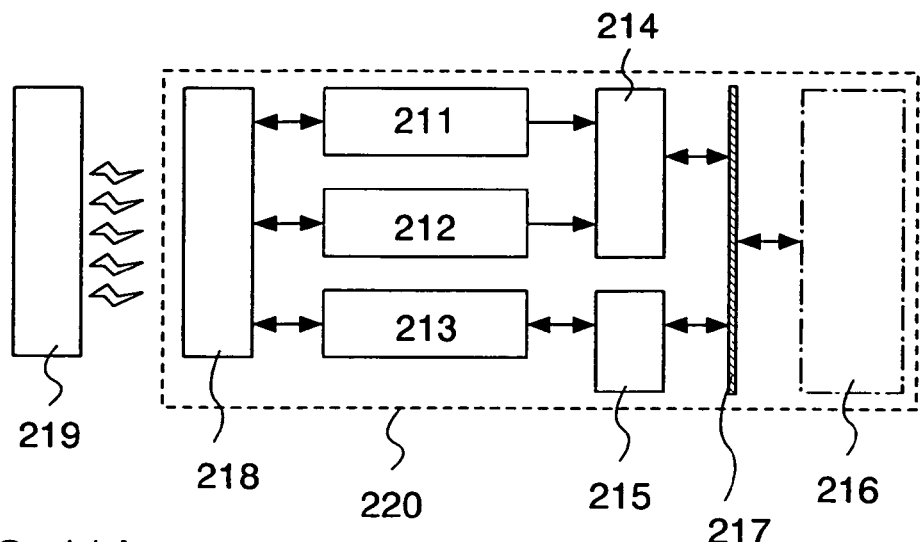
FIGS. 11A to 11C are views showing usage patterns of a semiconductor device of the invention.
Figure 11B:
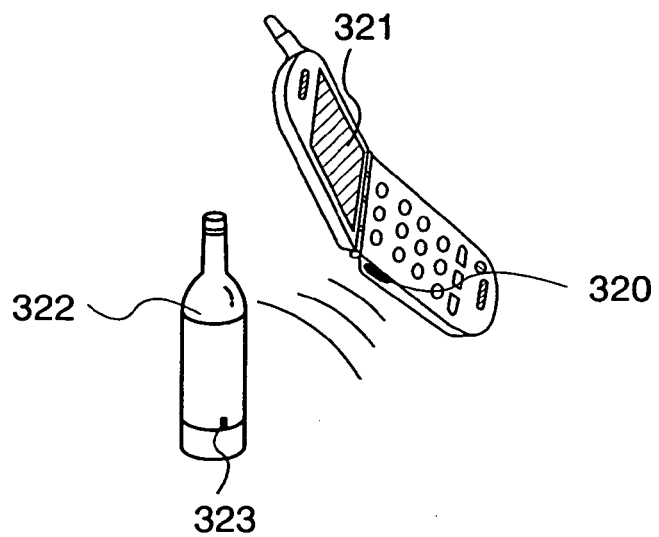
Figure 11C:
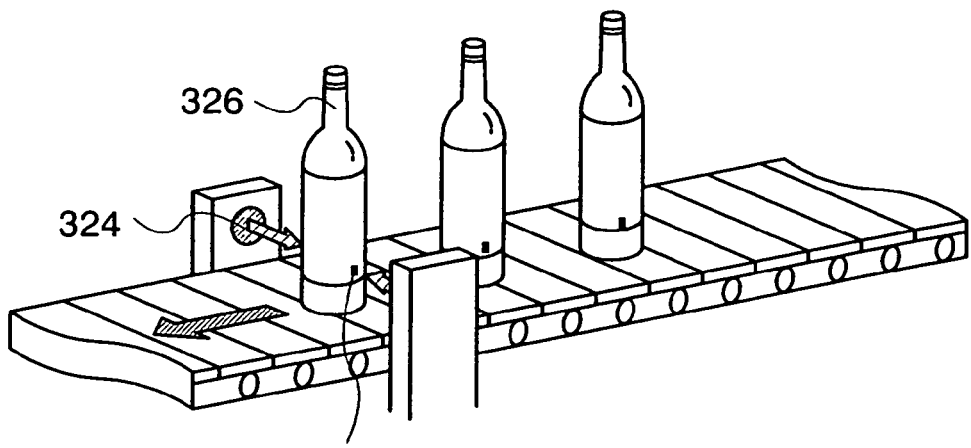

An RFID 220 has a function of communicating data without contact, and includes a power source circuit 211, a clock generating circuit 212, a data demodulation/modulation circuit 213, a control circuit 214 for controlling other circuit, an interface circuit 215, a memory 216, a data bus 217, and an antenna 218 which is formed according to a manufacturing method of the invention (FIG. 11A).

The power source circuit 211 functions to generate various power sources supplied for respective circuits in the semiconductor device, based on AC signals input from the antenna 218. The clock generating circuit 212 functions to generate various clock signals supplied for respective circuits in the semiconductor device, based on AC signals input from the antenna 218. The data demodulation/modulation circuit 213 functions to demodulate and modulate data for communicating with a reader/writer 219. The control circuit 214 functions to control the memory 216. The antenna 218 functions to transmit and receive an electromagnetic wave or radio waves. The reader/writer 219 controls processing regarding communication with the semiconductor device, control of the semiconductor device, and data thereof. It is to be noted that the RFID is not limited to this constitution; for example, another component such as a limiter circuit of power source voltage or hardware dedicated code processing may be additionally provided.

In addition, the RFID may be a type in which power source voltage is supplied to each circuit by radio waves without mounting a power source (a battery), a type in which power source voltage is supplied to each circuit by mounting a power source (a battery) instead of an antenna, or a type in which power source voltage is supplied by radio waves and a power source.

In the case of applying the semiconductor device of the invention to an RFID or the like, it is advantageous in that: non-contact communication is possible; multiple reading is possible; data writing is possible; transformation into various shapes is possible; directivity is wide and a wide recognition range is provided depending on the selected frequency; and the like. In addition, by using the wiring board manufactured according to Embodiment Mode 1 for a semiconductor device, a semiconductor device can be manufactured at low cost by a simple process, without performing complicated steps many times. An RFID can be applied to an IC tag which can identify individual information of a person or an object by non-contact radio communication, an adhesive label which can be attached to an object by label processing, a wristband for an event or amusement, or the like. In addition, an RFID may be processed with a resin material and it may be directly fixed to a metal obstructing radio communication. Furthermore, an RFID can be utilized for an operation of a system such as an entrance and exit management system and a checkout system.

Next, one mode of the practical use of the semiconductor device of the invention as an RFID will be described below. A reader/writer 320 is disposed on a side of a portable terminal including a display portion 321, and an RFID 323 is disposed on a side of merchandise 322 (FIG. 11B). When the reader/writer 320 is held up against the RFID 323 of the merchandise 322, information relating to the merchandise, such as a raw material and a place of origin of the merchandise, a test result per production process, a record of distribution process, and besides, description of the merchandise is displayed in the display portion 321. In addition, merchandise 326 can be inspected by using a reader/writer 324 and an RFID 325 disposed on the merchandise 326, when the merchandise 326 is transported by a belt conveyor (FIG. 11C). In this manner, information can be easily obtained, and a high function and a high added value are realized by utilizing an RFID for a system.

By using the wiring board manufactured according to Embodiment Mode 1 for a semiconductor device, a semiconductor device can be manufactured at low cost by a simple process, without performing complicated steps many times. This embodiment mode can be implemented freely combining with other embodiment modes and embodiments. That is, the materials and the forming methods described in other embodiment modes and embodiments can be used by freely combining with this embodiment mode.

Embodiment Mode 5

In this embodiment mode, one mode of a mass production method of wiring boards shown in the above-described embodiment modes will be described with reference to drawings. Specifically, a method for replacing conductive films formed by an electrolytic plating process over patterns formed over a plurality of glass substrates respectively, to a film by a roll-to-roll method will be described. In this embodiment mode, a method for replacing conductive films formed by an electrolytic plating process to a film, using a roll-to-roll transfer apparatus which is shown typically in FIGS. 12A and 12B, will be described. FIG. 12B is a schematic cross-sectional view of the apparatus shown in FIG. 12A.

Figure 12A:
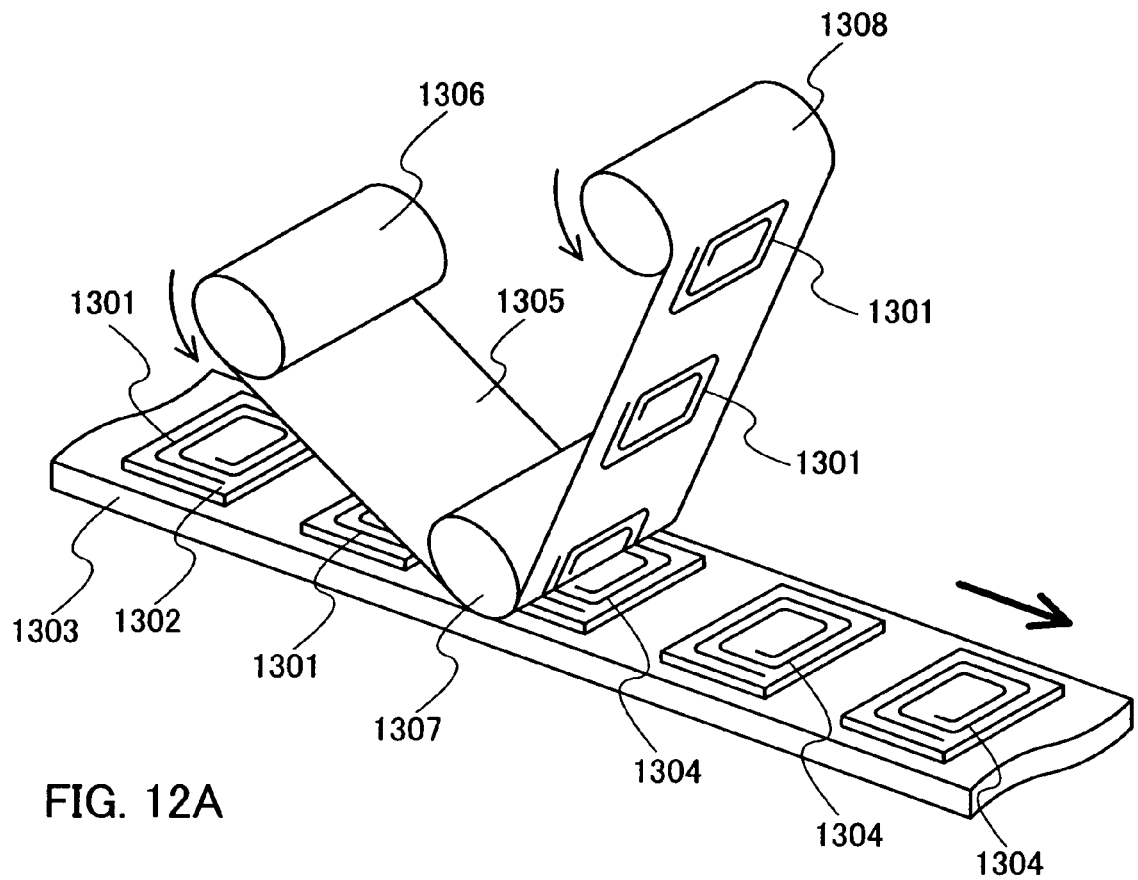
FIGS. 12A and 12B are views showing a manufacturing process of a wiring board of the invention.
Figure 12B:
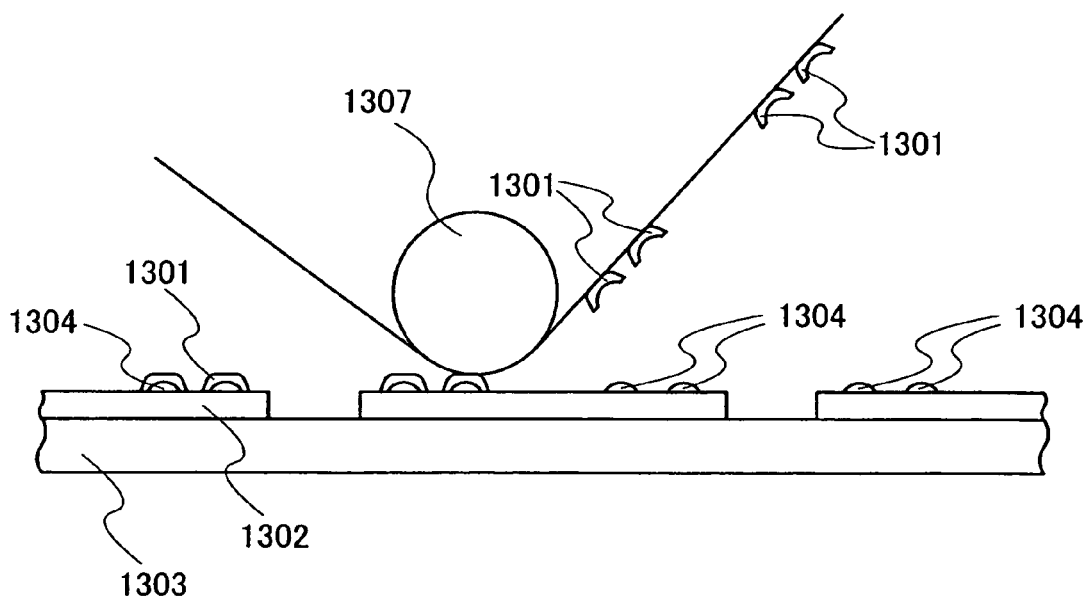

As shown in FIG. 12A, a roll-to-roll transfer apparatus of this embodiment mode has a structure in which a first roll 1306 around which a film 1305 is rolled, a second roll 1307 and a third roll 1308 are turned so that the film 1305 is rolled around the third roll 1308.

First, a glass substrate 1302 over which a conductive film 1301 is formed is set on a moving means 1303 (FIGS. 12A and 12B). In this embodiment mode, the moving means 1303 moves the glass substrate 1302 in the direction of an arrow. Here, the conductive film 1301 is formed over a pattern 1304, by using an electrolytic plating process in the same way as Embodiment Mode 1. As the glass substrate 1302, alkali-free glass, soda glass, lead glass, borosilicate glass, synthetic quarts, fused quartz, a silicon wafer, a ceramics substrate or the like may be used.

In addition, the pattern 1304 may be formed by any method such as a screen printing method, a method in which a conductive material is applied over the entire surface of a glass substrate and then a needless part is removed by laser beam, a method in which droplets are discharged by airflow from a narrow tube with a tiny opening which is typified by an ink-jet method, or a method in which a viscous material or droplets are pushed out from a narrow tube with a diameter of several millimeters or less using a dry gas which is typified by a dispense method. A size of the glass substrate can be selected arbitrarily within a range capable of this pattern formation method, as long as it is larger than a desired wiring board. For obtaining antenna patterns inexpensively by mass production, a large glass substrate over which as many desired patterns as possible can be arranged may be used. In addition, when a substrate over which a pattern is formed is soaked in an electrolytic plating bath for forming a conductive film over the pattern by an electrolytic plating process, the conductive film formed by the electrolytic plating process is not limited to Cu, and may be a metal such as Ni, Sn, Pb, Cr, Au, Ag, or rhodium, or an alloy of Au and Ag, Cu, Ni, Cd, Co or the like.

Next, by moving the plurality of glass substrates 1302 and turning the first roll 1306, the second roll 1307 and the third roll 1308, the conductive films 1301 formed over glass substrates 1302 respectively can be transferred to the film 1305. That is, by bringing the conductive film 1301 formed over the glass substrate 1302 into contact with the second roll 1307 through the film 1305, the conductive film 1301 is peeled from the pattern 1304 and only the conductive film 1301 is transferred to the film 1305. As the film 1305, a base substance formed of flexible synthetic resin such as plastic typified by polyethylene terephthalate (PET), polyethylene naphthalate (PEN), and polyether sulfone (PES), or acrylic, which is coated by a layer having adhesiveness or viscosity such as a thermoplastic resin, may be used. A material of the film 1305 is not limited to these, of course, and there is no particular limitation as long as the material is a flexible base substance having adhesiveness. In the roll-to-roll transfer apparatus of this embodiment mode, diameter of the rolls, the arrangement angle, running speed of the roll film, a film material to be used, thickness of the film, width of the film and length of the film can be selected arbitrarily, as long as a desired antenna pattern can be transferred.

In this embodiment mode, the film 1305 after transferring the conductive films 1301 is rolled up by the third roll 1308, and the patterns 1304 formed over the glass substrates 1302 can be reused.

This embodiment mode can be implemented freely combining with other embodiment modes and embodiments. That is, the materials and the forming methods described in other embodiment modes and embodiments can be used by freely combining with this embodiment mode.

Embodiment Mode 6

In this embodiment mode, one mode of a mass production method of wiring boards, which is different from the method described in Embodiment Mode 5, will be described with reference to drawings.

Figure 13:
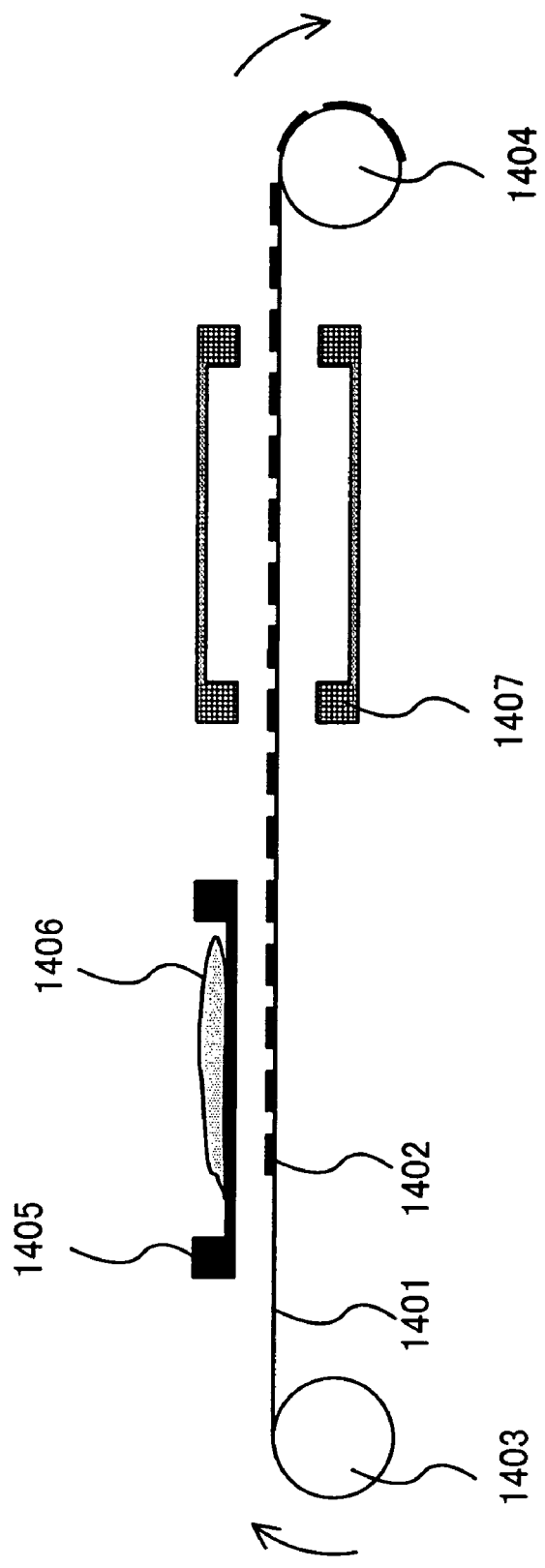
FIG. 13 is a view showing a manufacturing process of a wiring board of the invention.

In this embodiment mode, by using a roll-to-roll screen printing apparatus shown in FIG. 13, an antenna pattern 1402 is formed over a first film 1401 rolled around a roll 1403. The first film 1401 which is used being rolled around the first roll 1403 and a second roll 1404 has flexibility, and must be able to resist the highest treatment temperature in the manufacturing process later. As the first film, a plastic substrate such as polyethylene terephthalate (PET), polyethylene naphthalate (PEN), polyether sulfone (PES), polycarbonate (PC), nylon, polyether ether ketone (PEEK), polysulfone (PSF), polyetherimide (PEI), polyarylate (PAR), polybutylene terephthalate (PBT) or polyimide, a substrate formed of a flexible synthetic resin such as acrylic, and the like can be given as examples. The substrate does not have a significant limitation for its shape and area, and a substrate with several kilometers maximum can be rolled around one roll, for example, therefore the productivity is excellent. This point is very advantageous as compared with a substrate having poor flexibility such as a silicon substrate, a glass substrate or a ceramic substrate, for example.

First, while rolling up the first film 1401 by the second roll 1404, an antenna pattern material 1406 is applied on a printing plate 1405 so as to form antenna patterns 1402. Then, the antenna patterns 1402 are dried in a drying furnace 1407 and fixed to the first film 1401.

Figure 14:
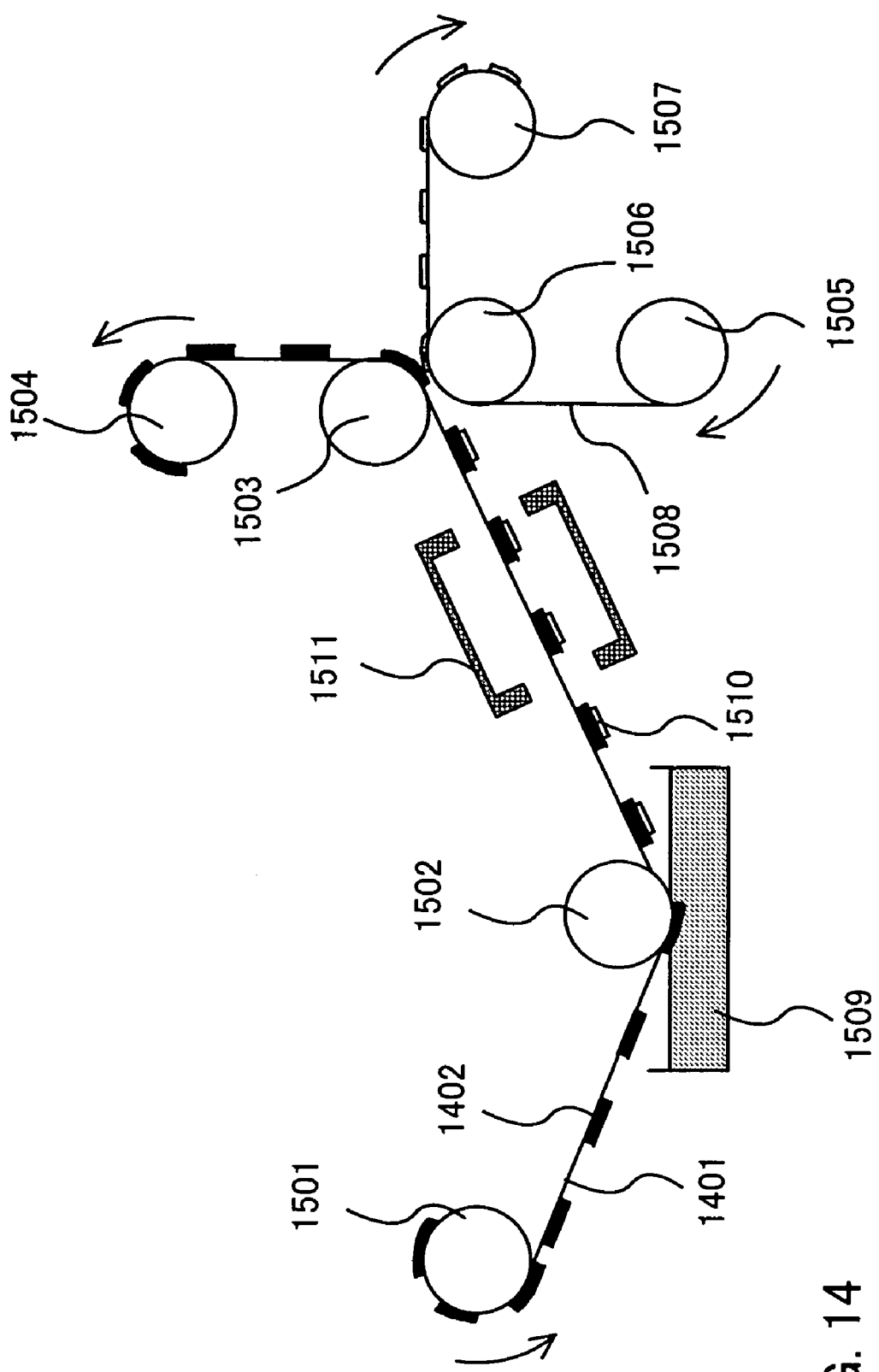
FIG. 14 is a view showing a manufacturing process of a wiring board of the invention.

Subsequently, the first film 1401 over which the antenna patterns 1402 is formed, rolled up by the second roll 1404, is placed on third to sixth rolls 1501 to 1504 shown in FIG. 14. At this time, by applying tension equally to the third to sixth rolls 1501 to 1504, equalization of film thickness and electric property of the conductive films can be achieved, and yield of the product manufacture can be improved. FIG. 14 is a schematic view of a roll-to-roll transfer apparatus which continuously performs formation of conductive films by an electrolytic plating process, drying, and separation and peeling of the conductive films. By performing these steps continuously by using the roll-to-roll transfer apparatus, there is a great advantage in cost reduction and improvement of the processing speed, as compared with the case where these steps are performed separately. Furthermore, although a step of forming the antenna patterns 1402 over the first film 1401 is performed by a different apparatus in this embodiment mode, the antenna patterns 1402 may be formed by the same apparatus as the steps of formation of conductive films by an electrolytic plating process, drying, and separation and peeling of the conductive films.

Subsequently, a second film 1508 is placed on seventh to ninth rolls 1505 to 1507. In this embodiment mode, a base material with a thermoplastic resin is used as the second film. As the second film, a base material with a layer having adhesiveness or viscosity on its surface may be used, not limited to the thermoplastic resin.

Subsequently, the first film 1401 is moved by turning the third to ninth rolls 1501 to 1507, and an electrolytic plating process is performed. In this embodiment mode, the antenna patterns 1402 are soaked in an electrolytic plating bath 1509 to perform the electrolytic plating process, and conductive films 1510 are formed over the antenna patterns 1402. After that, the conductive films 1510 are dried in a drying furnace 1511.

Next, by bringing the conductive film 1510 over the fifth roll 1503 into contact with the second film 1508 on the eighth roll 1506, the conductive film 1510 is separated from the antenna pattern 1402. That is, the conductive film 1510 is transferred to the second film 1508. The second film to which the conductive films 1510 are transferred is rolled up by the ninth roll 1507. By connecting the conductive film 1510 formed over the second film 1508 to an IC chip or the like, the second film 1508 can be used as a semiconductor device. In addition, the first film 1401 from which the conductive films 1510 are peeled is rolled up by the sixth roll 1504. By placing the rolled up first film 1401 in a roll-to-roll transfer apparatus connected to a plating bath again, conductive films can be formed reusing the antenna pattern 1402. As the number of times the first film 1401 is reused is increased, the cost for forming antennas can be reduced.

This embodiment mode can be implemented freely combining with other embodiment modes and embodiments. That is, the materials and the forming methods described in other embodiment modes and embodiments can be used by freely combining with this embodiment mode.

Embodiment Mode 7

An antenna of the invention can be used for a semiconductor device, and can be used being provided in, for example, paper money, coins, securities, certificates, bearer bonds, packing containers, books, recording media, personal items, vehicles, food items, clothes, healthcare items, livingwares, medicals, electronic apparatuses, or the like. Examples thereof will be described with reference to FIGS. 15A to 16D.

Figure 15A:
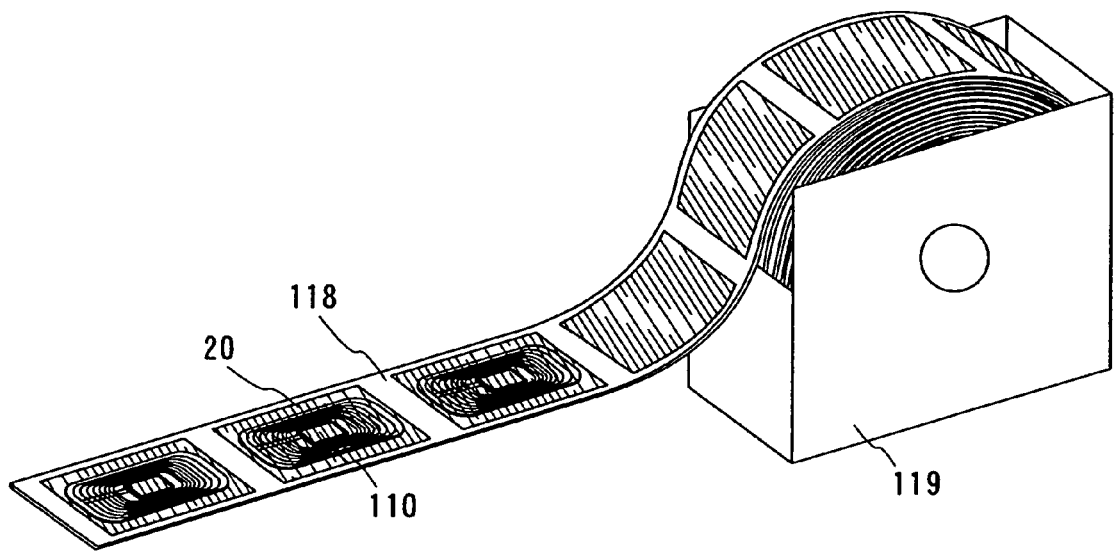
FIGS. 15A to 15E are views showing usage patterns of a semiconductor device of the invention.

FIG. 15A shows an example of a state of completed products of ID labels according to the invention. On a label board (separate paper) 118, a plurality of ID labels 20 each incorporating an IC chip 110 are formed. The ID labels 20 are put in a box 119. In addition, on the ID label, information on a commercial product or service (for example, a name of the product, a brand, a trademark, a trademark owner, a seller, a manufacturer, and the like) is written, while an ID number that is unique to the commercial product (or the kind of the commercial product) is assigned to the incorporated IC chip to make it possible to easily figure out forgery, infringement of intellectual property rights such as a patent and a trademark, and illegality such as unfair competition. In addition, a lot of information that is too much to write clearly on a container of the commercial product or the label, for example, the production area, selling area, quality, raw material, efficacy, use, quantity, shape, price, production method, directions for use, time of the production, time of the use, expiration date, instructions of the commercial product, information on the intellectual property of the commercial product and the like can be input in the IC chip so that a transactor and a consumer can access the information by using a simple reader. While the producer can also easily rewrite or delete the information, a transactor or consumer is not allowed to rewrite or delete the information.

Figure 15B:
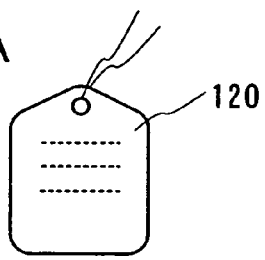

FIG. 15B shows an ID tag 120, which has an IC chip incorporated. By mounting the ID tag on commercial products, the management of the commercial products becomes easier. For example, in the case where the commercial product is stolen, the thief can be figured out quickly by tracing the pathway of the commercial product. In this way, by providing the ID tag, commercial products that are superior in so-called traceability can be distributed.

Figure 15C:
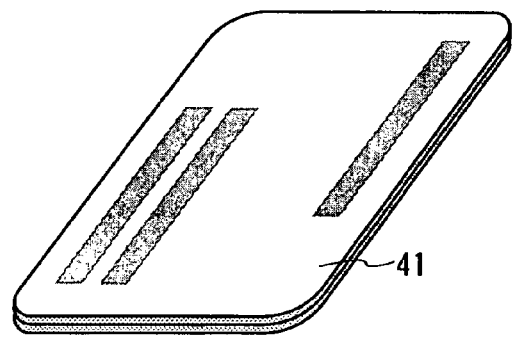

FIG. 15C shows an example of a state of a completed product of an ID card 41 according to the invention. The ID card includes all kinds of cards such as a cash card, a credit card, a prepaid card, an electronic ticket, electronic money, a telephone card, and a membership card.

Figure 15D:
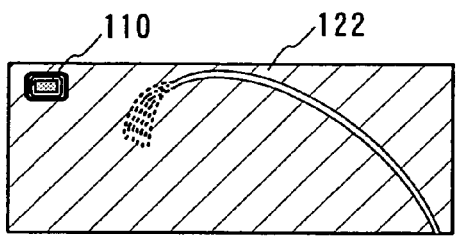

FIG. 15D shows an example of a state of a completed product of a bearer bond 122 according to the invention. The bearer bonds include, but not limited to of course, stamps, tickets, admission tickets, merchandise coupons, book coupons, stationery coupons, beer coupons, rice coupons, various gift coupons, various service coupons. In addition, a semiconductor device of the invention can be provided in securities such as a check, a certificate and a promissory note, certificates such as a driving license and a resident card, or the like, not limited to bearer bonds.

Figure 15E:
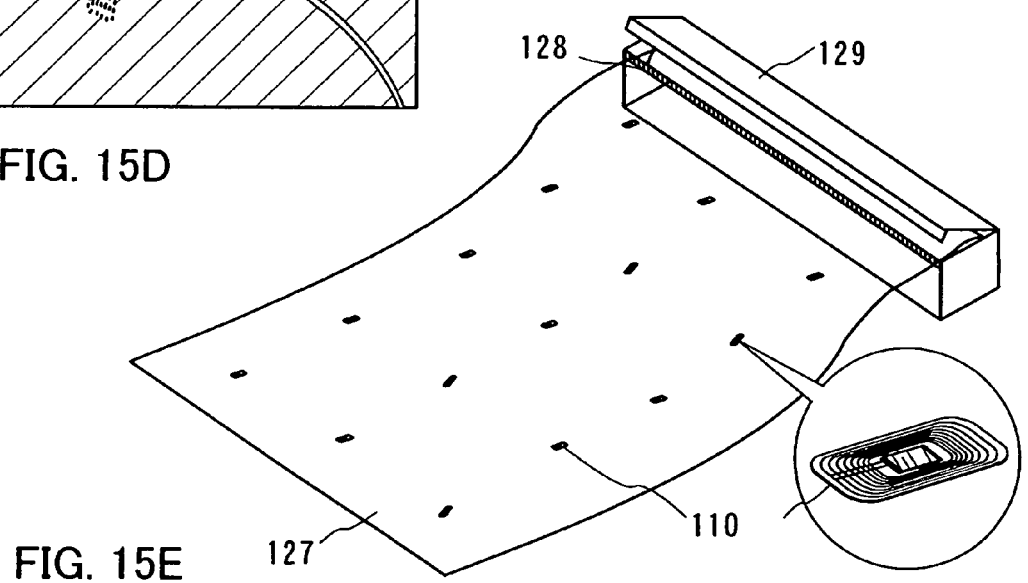

FIG. 15E shows a wrapping film 127 incorporating an IC chip 110, for wrapping a commercial product. The wrapping film 127 can be manufactured, for example, by scattering IC chips arbitrarily on a lower film and covering them with an upper film. The wrapping film 127 is put in a box 129, and a desired amount of film can be cut away with a cutter 128 and used. The material of the wrapping film 127 is not particularly limited. For example, materials such as a thin film resin, an aluminum foil, and paper can be used.

FIGS. 16A and 16B respectively show a book 123 and a plastic bottle 124 to which an ID label 20 according to the invention is attached. It is to be noted that the goods are not limited to these and the ID label may be attached to various goods such as: containers for packages such as paper for packing a box lunch; recording media such as DVD software and a video tape; vehicles including a wheeled vehicle such as a bicycle and a vessel; personal belongings such as a bag and glasses; foods such as food items and beverages; clothes such as clothing and footwear; healthcare items such as a medical device and a health appliance; livingware such as furniture and a lighting apparatus; medicals such as a medicine and an agricultural chemical; electronic apparatuses such as a liquid crystal display device, an EL display device, a television set (a television receiver, a thin television receiver), and a mobile phone. The IC chip that is used in the invention is quite thin, therefore, when the thin film integrated circuit is mounted on goods such as the book, the function or design is not damaged. Furthermore, in the case of a non-contact type thin film integrated circuit device, an antenna and a chip can be integrally formed to make it easier to transfer the non-contact type thin film integrated circuit device directly to a commercial product with a curved surface.

FIG. 16C shows a state in which the ID label 20 is directly attached to fresh food such as fruits 131. In addition, FIG. 16D shows an example in which fresh food such as vegetables 130 is wrapped in the wrapping films 127 incorporating IC chips 110. When an ID label is attached to a commercial product, there is a possibility that the ID label is peeled off. However, when the commercial product is wrapped in wrapping films, it is difficult to peel off the wrapping film, which brings some merit for security.

When an RFID is incorporated in bills, coins, securities, certificates, bearer bonds, and the like, forgery of them can be prevented. When an RFID is equipped for containers for packages, books, recording media, personal belongings, foods, livingware, electronic apparatuses, and the like, inspection systems, rental systems and the like can be performed more efficiently. When an RFID is equipped for vehicles, healthcare items, medicals, and the like, forgery and theft of them can be prevented and medicines can be prevented from being consumed in the wrong manner. An RFID may be attached to the surface of a product or embedded into a product. For example, an RFID may be embedded into the paper of a book, or an organic resin of a package.

In this manner, when the RFID is equipped for containers for packages, recording media, personal belongings, foods, clothes, livingware, electronic apparatuses, and the like, inspection system, rental system and the like can be performed more efficiently. The RFID also prevents vehicles from being forged or stolen. In addition, when the RFID is implanted into creatures such as animals, each creature can be identified easily. For example, when the RFID is implanted into creatures such as domestic animals, the year of birth, sex, breed and the like can be easily identified.

As described above, a semiconductor device using a wiring board of the invention can be provided in any goods and used. By using the invention, a semiconductor device can be manufactured at low cost by a simple process, without performing complicated steps many times. It is to be noted that this embodiment mode can be implemented freely combining with other embodiment modes and embodiments.

Embodiment 1

In this embodiment, the result of the manufacture of a wiring board described in Embodiment Mode 1 will be described.

First, a conductive resin was formed over a glass substrate by a screen printing method. In this embodiment, a screen printing plate of mesh number #250 was used, and a resin containing approximately 100 g of silver (Acheson (Japan) Ltd., Electrodag427SS, using a polyester-based resin as a binder) was used as the conductive resin. The resin containing silver was put on the printing plate, and applied on an opening corresponding to a pattern forming portion and the entire surface of the printing plate by a scraper. At this time, the scraper and the printing plate were not in contact with each other, and the scraper was moved at the speed of 80 mm/sec. Next, the resin containing silver was applied over the base material from the printing plate opening by using a squeegee. The squeegee was put in contact with the printing plate, and the speed was 100 mm/sec. The pushing by the squeegee was performed using compressed air, and the pushing pressure was 0.150 MPa. After the resin containing silver was applied over the base material, leveling of the printed matter was performed for five minutes in order to reduce unevenness of the resin, and then baking was performed for 30 minutes at 200° C. The baking was performed in an indirect heating atmosphere.

Figure 17A:
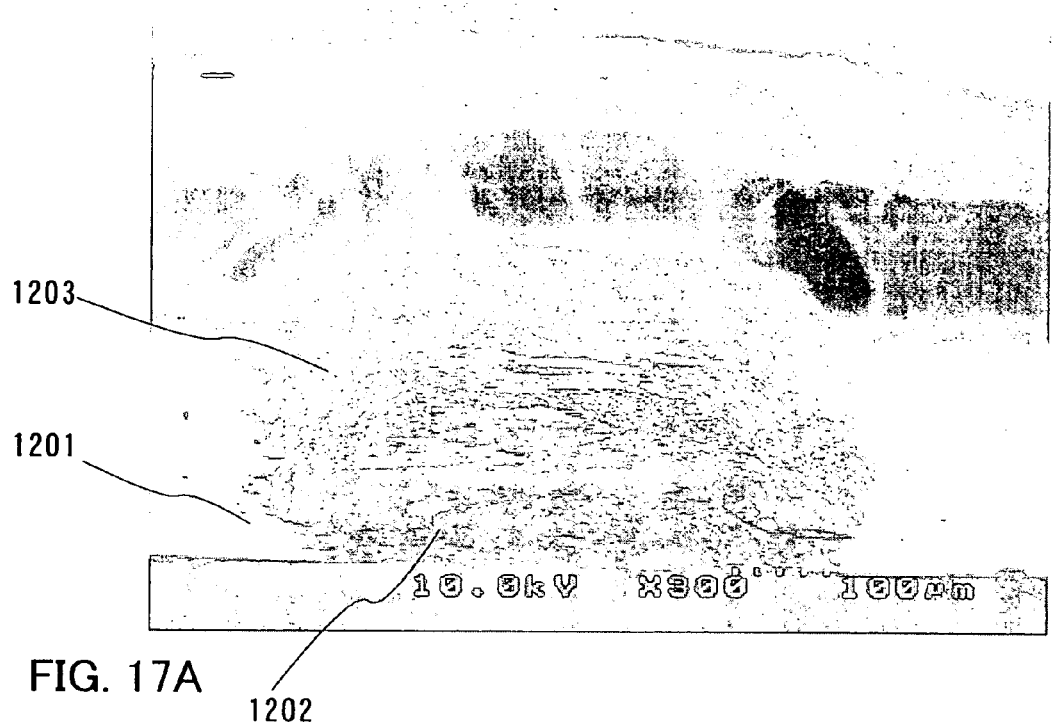
FIGS. 17A and 17B are photographs showing a manufacturing result of a wiring board of the invention.

After that, an electrolytic plating process of copper (Cu) was performed with respect to a substrate over which the resin containing silver is formed. The electrolytic plating bath used in this embodiment is 500 ml of water mixed with 146.38 g of copper sulfate pentahydrate, 15 ml of concentrated sulfuric acid and 150 mg of polyethyleneglycol of which the average molecular weight is 2000. First, 146.38 g of copper sulfate pentahydrate and 500 ml of water were put in a beaker, and while agitating it by a stirrer, 15 ml of concentrated sulfuric acid and 150 mg of polyethyleneglycol were added, and all of them were melted. After that, the resin containing silver over the substrate was set as a cathode, and a copper plate (containing phosphorus) was set as an anode. By applying 0.03 A of a current for six minutes, while agitating the electrolytic plating bath, a copper film was formed on the resin containing silver formed over the substrate. The current density when the electrolytic plating process is performed was approximately 1.0 A/cm$^2$. After the electrolytic plating, the substrate was taken out from the electrolytic bath, and the substrate was washed using pure water. An SEM (scanning electron microscope) photograph of the copper film 1203 formed on the resin 1202 containing silver formed over the glass substrate 1201, by the electrolytic plating process according to this embodiment is shown in FIG. 17A.

Figure 17B:

Subsequently, a transposing base substance was attached to the copper film, and the copper film and the resin containing silver were peeled from each other by peeling the transposing base substance from the substrate. As shown in FIG. 17B, since the copper film and the resin containing silver are easily peeled from each other, the copper film could be manufactured without difficulty. The reason why a pattern and a conductive film formed by electrolytic plating are easily peeled from each other is considered to be as follows: against the stress of the conductive film, which is generated as the conductive film formed by the electrolytic plating process grows, adhesion in an interface between the pattern and the conductive film decreases relatively, which leads to separation and peeling. The adhesion in the interface between the pattern and the conductive film is considered to be influenced by a shape of the pattern, a shape of the pattern surface (the degree of unevenness), a material of the pattern, electric characteristics of the pattern, mechanical characteristics of the pattern, a material of the conductive film formed by the electrolytic plating process, electric characteristics of the conductive film formed by the electrolytic plating process, mechanical characteristics of the conductive film formed by the electrolytic plating process, wettability (surface characteristic) of the pattern and the electrolytic plating bath, or the like.

This application is based on Japanese Patent Application serial no. 2005-200756 filed in Japan Patent Office on Jul. 8, 2005, the entire contents of which are hereby incorporated by reference.

What is claimed is:

1. A method for manufacturing a semiconductor device comprising the steps of:
    forming a conductive film over a pattern having conductivity by an electrolytic plating process, wherein the pattern is provided over a first substrate;
    attaching a base substance to the conductive film;
    separating the first substrate and the pattern from the conductive film and the base substance;
    forming a peeling layer over a second substrate;
    forming an IC chip including at least one thin film transistor over the peeling layer;
    attaching the base substance to the second substrate with the conductive film, the IC chip and the peeling layer interposed therebetween so that the conductive film is electrically connected to the IC chip;
    separating the base substance from the conductive film;
    covering the IC chip and the conductive film with a third substrate; and
    removing or separating the peeling layer from the IC chip to separate the second substrate from the IC chip.

2. The method for manufacturing a semiconductor device according to claim 1, wherein the third substrate comprises polypropylene, polyester, vinyl, polyvinyl fluoride, vinyl chloride, paper made of a fibrous material, or an antistatic film.

3. The method for manufacturing a semiconductor device according to claim 1, wherein the third substrate is a laminated film of polyester, polyamide, an inorganic deposition film, or paper, and an adhesive synthetic resin formed of an acrylic-based synthetic resin or an epoxy-based synthetic resin.

4. The method for manufacturing a semiconductor device according to claim 1, wherein the pattern comprises a material including Fe, Al, Cu, Ag, Ni, W, Ti, Mg, Nb, or Sn.

5. The method for manufacturing a semiconductor device according to claim 1, wherein the conductive film includes an alloy of Ag and Au, an alloy of Cu and Au, an alloy of Ni and Au, an alloy of Cd and Au, an alloy of Co and Au, Cu, Ni, Sn, Pb, Cr, Au, Ag, Rh, Co, or Cd.

6. The method for manufacturing a semiconductor device according to claim 1, wherein the conductive film serves as an antenna.

7. The method for manufacturing a semiconductor device according to claim 1, wherein the conductive film is electrically connected to the thin film transistor.

8. The method for manufacturing a semiconductor device according to claim 1, wherein the semiconductor device is an IC tag, an ID tag, a Radio Frequency tag, a Radio Frequency Identification, a wireless tag, an electronic tag, a wireless processor, a wireless memory, or a wireless chip.

9. The method for manufacturing a semiconductor device according to claim 1, wherein the first substrate comprises one selected from the group consisting of a glass substrate, a quartz substrate, a ceramic substrate, a silicon substrate, and a plastic substrate.

10. A method for manufacturing a semiconductor device comprising the steps of:
    forming a conductive film over a pattern having conductivity by an electrolytic plating process, wherein the pattern is provided over a first substrate;
    attaching a base substance to the conductive film;
    separating the first substrate and the pattern from the conductive film and the base substance;
    forming a peeling layer over a second substrate;
    forming an IC chip including at least one thin film transistor over the peeling layer;
    attaching the base substance to the second substrate with the conductive film the IC chip and the peeling layer interposed therebetween so that the conductive film is electrically connected to the IC chip;
    separating the base substance from the conductive film;
    covering the IC chip and the conductive film with a third substrate;
    removing or separating the peeling layer from the IC chip to separate the second substrate from the IC chip;
    attaching a fourth substrate to the third substrate with the IC chip and the conductive film interposed therebetween; and
    performing one or both of a heat treatment and a pressure treatment so that the IC chip and the conductive film is sealed by the third substrate and the fourth substrate.

11. The method for manufacturing a semiconductor device according to claim 10, wherein the third substrate comprises polypropylene, polyester, vinyl, polyvinyl fluoride, vinyl chloride, paper made of a fibrous material, or an antistatic film.

12. The method for manufacturing a semiconductor device according to claim 10, wherein the third substrate is a laminated film of polyester, polyamide, an inorganic deposition film, or paper, and an adhesive synthetic resin formed of an acrylic-based synthetic resin or an epoxy-based synthetic resin.

13. The method for manufacturing a semiconductor device according to claim 10, wherein the pattern comprises a material including Fe, Al, Cu, Ag, Ni, W, Ti, Mg, Nb, or Sn.

14. The method for manufacturing a semiconductor device according to claim 10, wherein the conductive film includes an alloy of Ag and Au, an alloy of Cu and Au, an alloy of Ni and Au, an alloy of Cd and Au, an alloy of Co and Au, Cu, Ni, Sn, Pb, Cr, Au, Ag, Rh, Co, or Cd.

15. A method for manufacturing a semiconductor device according to claim 10, wherein the conductive film serves as an antenna.

16. A method for manufacturing a semiconductor device according to claim 10, wherein the conductive film is electrically connected to the thin film transistor.

17. A method for manufacturing a semiconductor device according to claim 10, wherein the semiconductor device is an IC tag, an ID tag, a Radio Frequency tag, a Radio Frequency Identification, a wireless tag, an electronic tag, a wireless processor, a wireless memory, or a wireless chip.

18. A method for manufacturing a semiconductor device according to claim 10, wherein the first substrate comprises one selected from the group consisting of a glass substrate, a quartz substrate, a ceramic substrate, a silicon substrate, and a plastic substrate.

* * * * *